US011892886B2

(12) United States Patent
Degner

(10) Patent No.: US 11,892,886 B2
(45) Date of Patent: *Feb. 6, 2024

(54) ELECTRONIC DEVICE WITH ADJUSTABLE AIRFLOW DIVERSION

(71) Applicant: Apple Inc., Cupertino, CA (US)

(72) Inventor: Brett W. Degner, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/658,992

(22) Filed: Apr. 12, 2022

(65) Prior Publication Data

US 2022/0236778 A1 Jul. 28, 2022

Related U.S. Application Data

(63) Continuation of application No. 17/005,839, filed on Aug. 28, 2020, now Pat. No. 11,314,297.

(60) Provisional application No. 63/056,278, filed on Jul. 24, 2020.

(51) Int. Cl.
G06F 1/20 (2006.01)
G06F 1/16 (2006.01)
H05K 7/20 (2006.01)

(52) U.S. Cl.
CPC .......... *G06F 1/203* (2013.01); *G06F 1/1618* (2013.01); *G06F 1/1656* (2013.01); *H05K 7/20145* (2013.01); *H05K 7/20172* (2013.01)

(58) Field of Classification Search
CPC ...... G06F 1/203; G06F 1/1618; G06F 1/1656; H05K 7/20145; H05K 7/20172
See application file for complete search history.

(56) References Cited

U.S. PATENT DOCUMENTS

| 6,816,371 | B2 | 11/2004 | Agata et al. | |
| 6,909,602 | B2 * | 6/2005 | Dietrich | G06F 1/1656 361/679.48 |
| 8,369,084 | B2 | 2/2013 | Chen et al. | |
| 8,937,806 | B2 | 1/2015 | Senatori | |
| 2010/0214743 | A1 * | 8/2010 | Huang | G06F 1/1667 361/679.01 |
| 2018/0217644 | A1 | 8/2018 | Dan et al. | |
| 2022/0011812 | A1 * | 1/2022 | Lin | G06F 1/203 |

* cited by examiner

Primary Examiner — Mukundbhai G Patel
(74) Attorney, Agent, or Firm — BAKERHOSTETLER

(57) ABSTRACT

A portable electronic device is disclosed. The portable electronic device may include a laptop computing device that includes a base portion and a display housing rotationally coupled to the base portion. The base portion includes a fan designed to drive heated air out of the base portion, thus cooling the portable electronic device. A dynamic (movable) air diverter is integrated into the base portion near the fan's outlet. The air diverter is designed to direct airflow from the fan outlet. Moreover, the air diverter can be repositioned by, for example, rotating the display housing relative to the base portion. As a result of the repositioned air diverter, the airflow from the fan outlet is redirected out of the portable electronic device through a different location. The air diverter can be positioned in different discrete locations, or alternatively, can move continuously with the rotational movement of the display housing.

20 Claims, 19 Drawing Sheets

ELECTRONIC DEVICE WITH ADJUSTABLE AIRFLOW DIVERSION

CROSS-REFERENCE TO RELATED APPLICATIONS

The present application is a continuation of U.S. application Ser. No. 17/005,839, filed Aug. 28, 2020, entitled "ELECTRONIC DEVICE WITH ADJUSTABLE AIRFLOW DIVERSION," set to issue Apr. 26, 2022 as U.S. Pat. No. 11,314,297, which claims the benefit of U.S. Provisional Application No. 63/056,278, entitled "ELECTRONIC DEVICE WITH ADJUSTABLE AIRFLOW DIVERSION," filed Jul. 24, 2020, the content of which is incorporated herein by reference in its entirety for all purposes.

FIELD

The following description relates to electronic devices. In particular, the following description relates to portable electronic devices with dynamic airflow diversion capabilities. For instance, a laptop computing device may include an airflow diverter (e.g., louver) capable of changing its position based upon the position of a housing part of the laptop computing device, thereby directing (or redirecting) airflow from a fan located in the laptop computing device. As a result, the airflow (e.g., heated exhaust air) can be directed out of the laptop computing device through different openings. For laptop computing devices with a display housing and a base portion, the position of the airflow diverter, and subsequent direction of airflow by the airflow diverter, may depend upon the position/angle of the display housing relative to the base portion. Other considerations, such as the presence of a user, can be used to determine the position of the airflow diverter.

BACKGROUND

Electronic devices are known to include one or more fans designed to drive heated air away from heat-generating components (within an electronic device) and out of the electronic device. In this regard, the heat-generating components are less susceptible to breakdown or damage. Further, when heat is removed from the electronic device, a user is less likely to be injured (e.g., burned) by the electronic device.

In some instances, a structure (e.g., stationary blade) is inserted near the exhaust of the fan(s) such that the structure directs the air from the fan(s) in a particular direction. However, this structure is physically secured to the electronic device in a static matter, i.e., the structure does not move. As a result of the stationary nature of the structure, the direction of flow of the exhaust air is the same regardless of other considerations, such as the position of one housing part relative to another housing part. In this regard, for a laptop that includes a display housing and a base portion with a fan and a structure near the fan's exhaust, the air exiting the fan's exhaust flows in the same direction regardless of whether the laptop is in a closed configuration (defined by the display housing positioned over the base portion) or an open configuration (defined by the display housing rotated away from the base portion). The stationary/static nature of the structure may cause heated exhaust air to flow toward the display housing or the user, resulting in an undesired user experience.

SUMMARY

In one aspect, a portable electronic device is described. The portable electronic device may include a base portion. The portable electronic device may further include a display housing rotationally coupled with the base portion. In some embodiments, the display housing and the base portion define a first opening and a second opening. The portable electronic device may further include a fan disposed in the base portion. The fan may be configured to expel air. The portable electronic device may further include an air diverter configured to move from a first position to a second position different from the first position. In some embodiments, the first position directs the air expelled by the fan toward the first opening, and wherein the second position directs the air expelled by the fan toward the second opening.

In another aspect, a portable electronic device is described. The portable electronic device may include a base portion. The portable electronic device may further include a display housing rotationally coupled with the base portion. The portable electronic device may further include a fan that includes a fan outlet configured to expel the air from the base portion. The portable electronic device may further include an air diverter. In some embodiments, the air diverter directs the air expelled by the fan outlet in a first direction when the display housing forms a first angle with the base portion. Also, in some embodiments, the air diverter directs the air expelled by the fan outlet in a second direction, different from the first direction, when the display housing forms a second angle with the base portion. The second angle can be different from the first angle.

In another aspect, a portable electronic device is described. The portable electronic device may include a base portion. The portable electronic device may further include a display housing rotationally coupled with the base portion. The portable electronic device may further include a fan that includes a fan outlet configured to expel air from the base portion. The portable electronic device may further include an air diverter moveable with respect to the fan. The portable electronic device may further include a vent grill positioned between the air diverter and the fan. The vent grill may include an opening through which the air from the fan passes to the air diverter.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
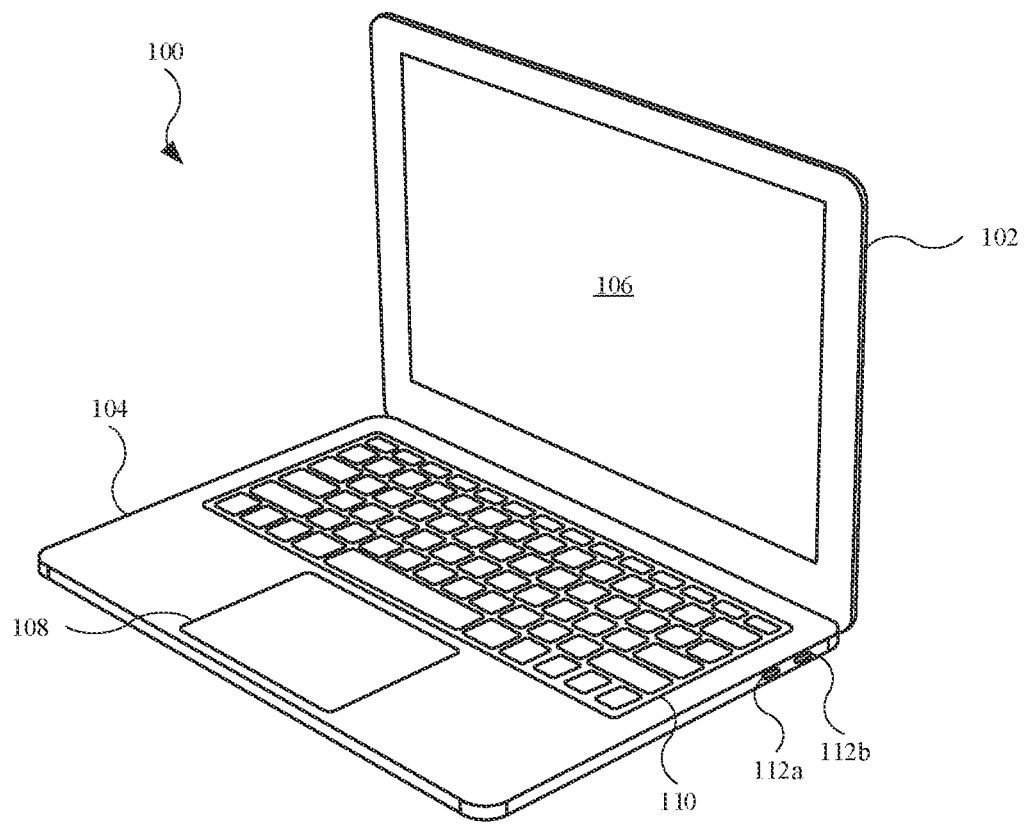
FIG. 1 illustrates an isometric view of an embodiment of an electronic device, showing the electronic device in an open position.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to electronic devices, including portable electronic devices, that include dynamic air diversion mechanisms designed to alter the direction of airflow. The air diversion mechanism may include an air diverter (e.g., louver) or another structure used to redirect airflow expelled by a fan exhaust within the electronic device. Moreover, the air diversion mechanism can rotate/pivot, and thus be repositioned in the electronic device. As a result, the air diversion mechanism causes the airflow (from the fan exhaust) to exit/leave the electronic device through a desired opening in the electronic device.

Some considerations for the desired opening include cooling efficiency, position of a housing part (e.g., display housing), and ergonomics. For example, the direction of airflow may depend in part upon a position/configuration of the electronic device. An exemplary embodiment of an electronic device includes a portable electronic device, such as a laptop computing device (or simply, laptop), that includes a base portion and a display housing that is rotationally coupled to the base portion. When the laptop is closed, the display housing covers the base portion. The air diversion mechanism can be positioned to direct air from the fan exhaust (assuming the fan is still running) through a bottom, or lower, opening of the electronic device. In other words, the air diversion mechanism can drive air away from the display housing, and in particular, away from a relatively small gap between the display housing and the base portion. Conversely, when the laptop is open, the display housing is rotated away from the base portion such that the user can interact with the electronic device. In this open position, the air diversion mechanism can be repositioned to direct air from the fan exhaust through a top, or upper, opening of the electronic device. In other words, the air diversion mechanism can drive through an opening between display housing and an upper region of the base portion. This may prevent or reduce the likelihood of user exposure to the airflow from the fan exhaust, which is relatively hot.

The detailed description describes several ways in which the air diversion mechanism is controlled. In some exemplary embodiments, the air diversion mechanism is passively driven by intermittent contact/engagement with the display housing. In other exemplary embodiments, the air diversion mechanism is coupled the display housing such that rotational movement of the display housing causes a corresponding (and continuous) movement of the air diversion mechanism. Additionally, in some exemplary embodiments, the electronic device includes one or more sensors that dictate the movement of the air diversion mechanism, and thus contribute to an actively controlled system for controlling the movement of the air diversion mechanism. For instance, the position of the air diversion mechanism is dictated by an input from a sensor, and movement of the air diversion mechanism is controlled by a motor. In these exemplary embodiments, an electronic device may include a temperature sensor that detects the presence of a user. The input provided by the temperature sensor may cause movement of the air diversion mechanism to direct airflow away from the user. Other sensors, such as a capacitive sensor, are possible for the detection/presence of the user in proximity to an electronic device. Alternatively, an electronic device may include an orientation sensor that detects the orientation/position of the display housing relative to the base portion. The input provided by the orientation sensor may cause movement of the air diversion mechanism, and thus direct airflow toward a bottom opening (when the electronic device is closed) or toward an upper opening (when the electronic device is open).

These and other embodiments are discussed below with reference to FIGS. 1-31. However, those skilled in the art will readily appreciate that the detailed description given herein with respect to these Figures is for explanatory purposes only and should not be construed as limiting.

FIG. 1 illustrates an isometric view of an embodiment of an electronic device 100, showing electronic device 100 in an open position. As shown, electronic device 100 is a portable electronic device, such as a laptop computing device. In this regard, electronic device 100 may include a display housing 102 rotationally coupled to a base portion 104 by one or more hinges (not shown in FIG. 1). Display housing 102 and base portion 104 may each be formed from metal, such as aluminum or aluminum alloy (as non-limiting examples). As shown, display housing 102 is rotated away from base portion 104, and electronic device 100 defines an open position.

Display housing 102 carries a display 106 designed to present visual information in the form of textual information, still images, and motion (video) images. Base portion 104 may include several input mechanisms, such as a track pad 108, or touch pad, and a keyboard 110. Additionally, base portion 104 carries several components. For example, although not shown, base portion 104 may carry processing circuits (integrated circuits, central processing units, graphics processing units), memory circuits, audio speakers, microphones, batteries, fans, and flexible circuitry to couple the components together. Also, base portion 104 includes one or more ports, such as a port 112a and a port 112b. These ports are designed to electrically couple electronic device 100 to an external source (not shown in FIG. 1), such as an external data source, an external power source, and/or a standalone display. Ports 112a and 112b may each define a port configured for an industry standard, such as Universal Serial Bus ("USB"), including USB-C, as a non-limiting example.

Figure 2:
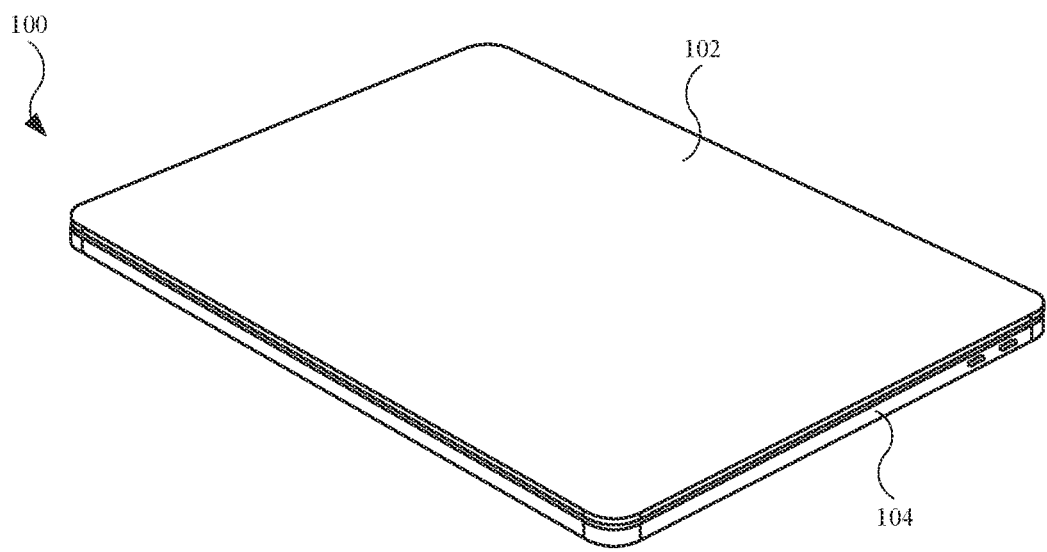
FIG. 2 illustrates an isometric view of the electronic device shown in FIG. 1, showing the electronic device in a closed position.

FIG. 2 illustrates an isometric view of electronic device 100 shown in FIG. 1, showing electronic device 100 in a closed position. As shown, display housing 102 is positioned over base portion 104, thereby concealing several aforementioned input mechanisms (shown in FIG. 1) of electronic device 100.

Figure 3:
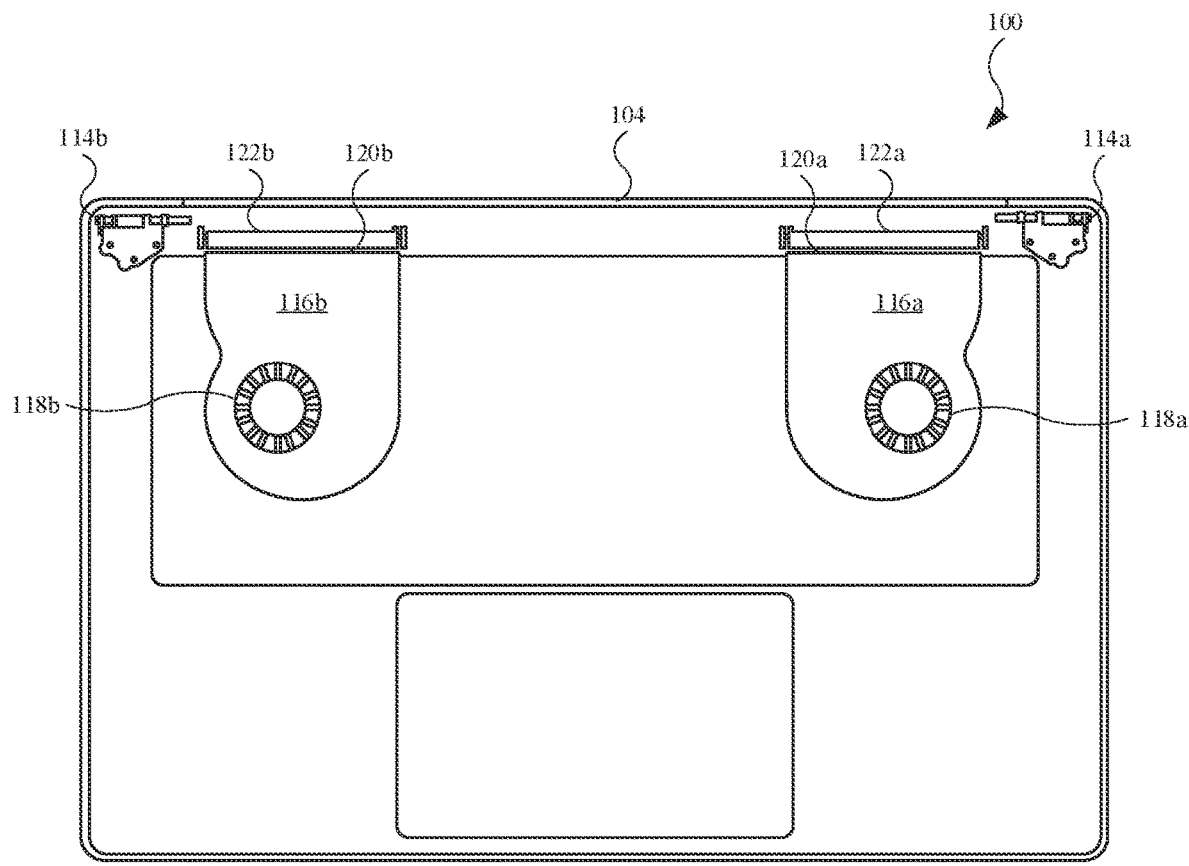
FIG. 3 illustrates a plan view of the electronic device, showing internal features located in the base portion.

FIG. 3 illustrates a plan view of electronic device 100, showing internal features located in base portion 104. For purposes of illustration, a housing part of base portion 104 is removed. As shown, electronic device 100 includes a hinge 114a and a hinge 114b secured with base portion 104. Hinges 114a and 114b further couple with display housing 102 (shown in FIG. 1), thereby allowing display housing 102 to rotate. Although not shown, base portion 104 carries several components that generate heat during use, such as integrated circuits, processors, batteries, and the like. In order to cool these (and other) components, base portion 104 includes one or more fans, such as a fan 116a and a fan 116b. Each of fans 116a and 116b include a fan inlet 118a and a fan inlet 118b, respectively, designed to draw heated air into their respective fans. Fans 116a and 116b include a fan outlet 120a and a fan outlet 120b, respectively, that provide an exit for their respective fans.

In order to direct the heated air exiting the fans, electronic device 100 may include air diversion mechanisms located in base portion 104. As shown, base portion 104 includes an air diverter 122a and an air diverter 122b. Air diverters 122a and 122b can act as a louver by directing, or in some cases redirecting, the heated air exiting fans 116a and 116b, respectively, such that the heated air leaves the electronic device 100 though a desired opening(s). Moreover, air diverters 122a and 122b can be dynamic, or rotatable/movable. In some exemplary embodiments, the position of air diverters 122a and 122b is based in part on the position/angle of the display housing 102 (shown in FIG. 1) relative to base portion 104. This will be shown and described below.

Figure 4:
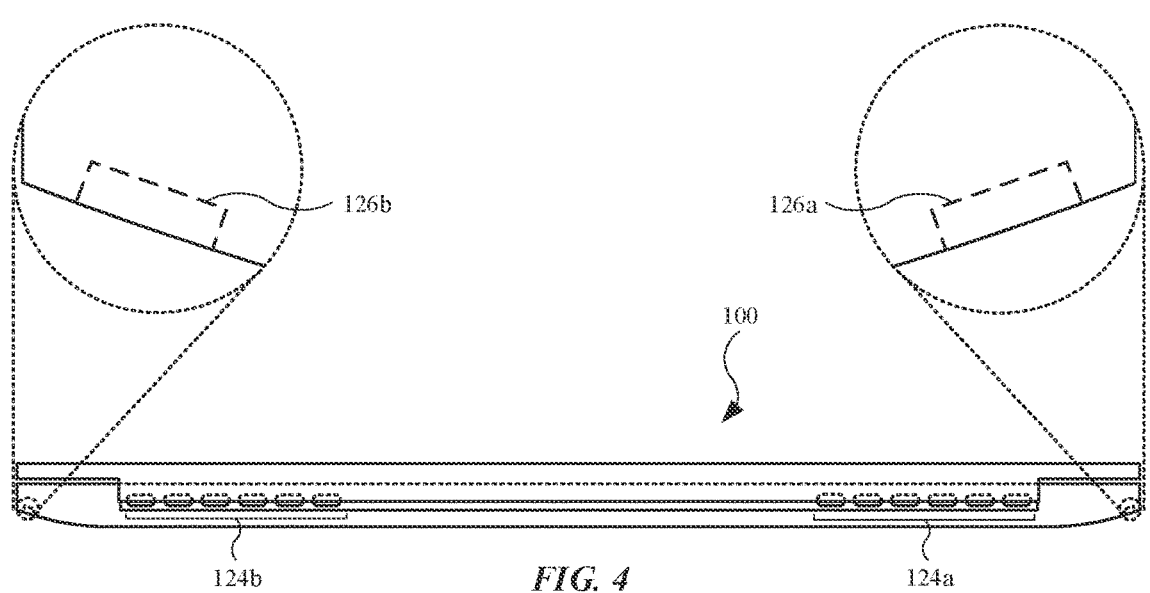
FIG. 4 illustrates a side view of the electronic device, showing several vent openings of the electronic device.

FIG. 4 illustrates a side view of electronic device 100, showing several vent openings of electronic device 100. The side view shown in FIG. 4 may refer to a rear view of electronic device 100. As shown, electronic device 100 includes vent grill 124a and vent grill 124b. Each of vent grills 124a and 124b includes several openings that provide an exit location, or vent, for the heated air. Air diverters 122a and 122b (shown in FIG. 3) can direct the heated air to the vent grill 124a and the vent grill 124b, respectively, where the heat air can ultimately exit the electronic device 100 through one or more openings (shown below). Also, as shown in the enlarged view, electronic device 100 includes an opening 126a and an opening 126b, thereby allowing electronic device 100 to receive ambient air used to carry heat away from the components of electronic device 100.

Figure 5:
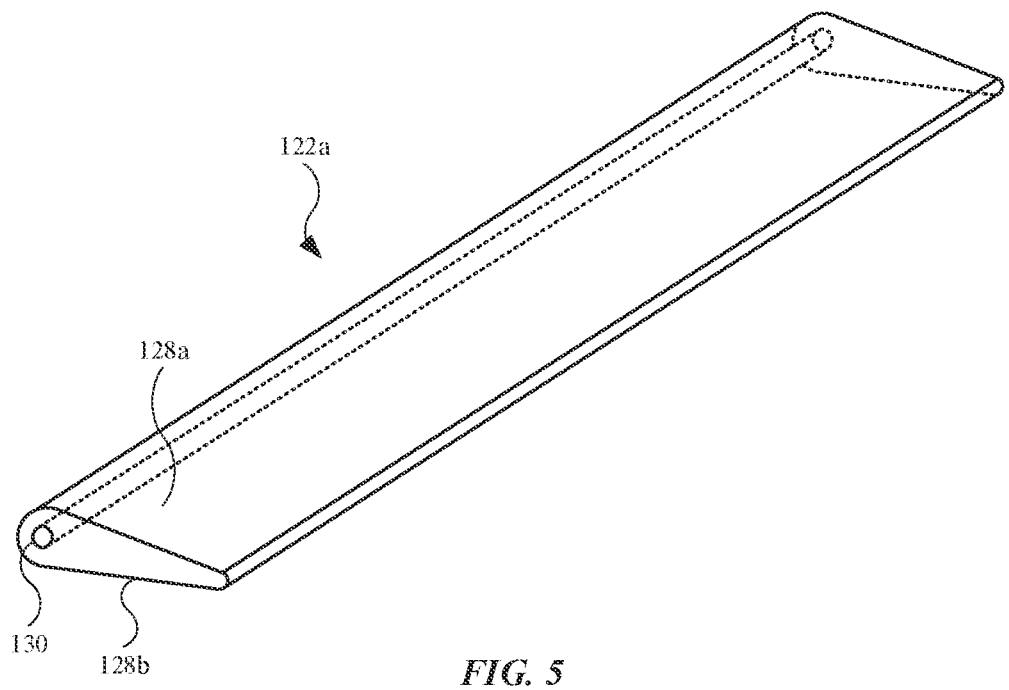
FIG. 5 illustrates an isometric of the air diverter.

FIG. 5 illustrates an isometric of air diverter 122a. Air diverter 122a may include multiple air diversion surfaces, such as an air diversion surface 128a and an air diversion surface 128b. As shown, air diversion surfaces 128a and 128b are non-parallel to each other. However, in other embodiments (not shown), an air diversion may include parallel air diversion surfaces. Also, air diverter 122a includes an opening 130 designed to receive a shaft (not shown in FIG. 5), or alternatively, a shaft through each end of opening 130. Due in part to the dynamic nature of air diverter 122a, the shaft(s), when inserted into opening 130, may define a pivot, or rotation, point for movement of air diverter 122a. Air diverter 122b (shown in FIG. 3) may include any features shown and described for air diverter 122a.

Figure 6:
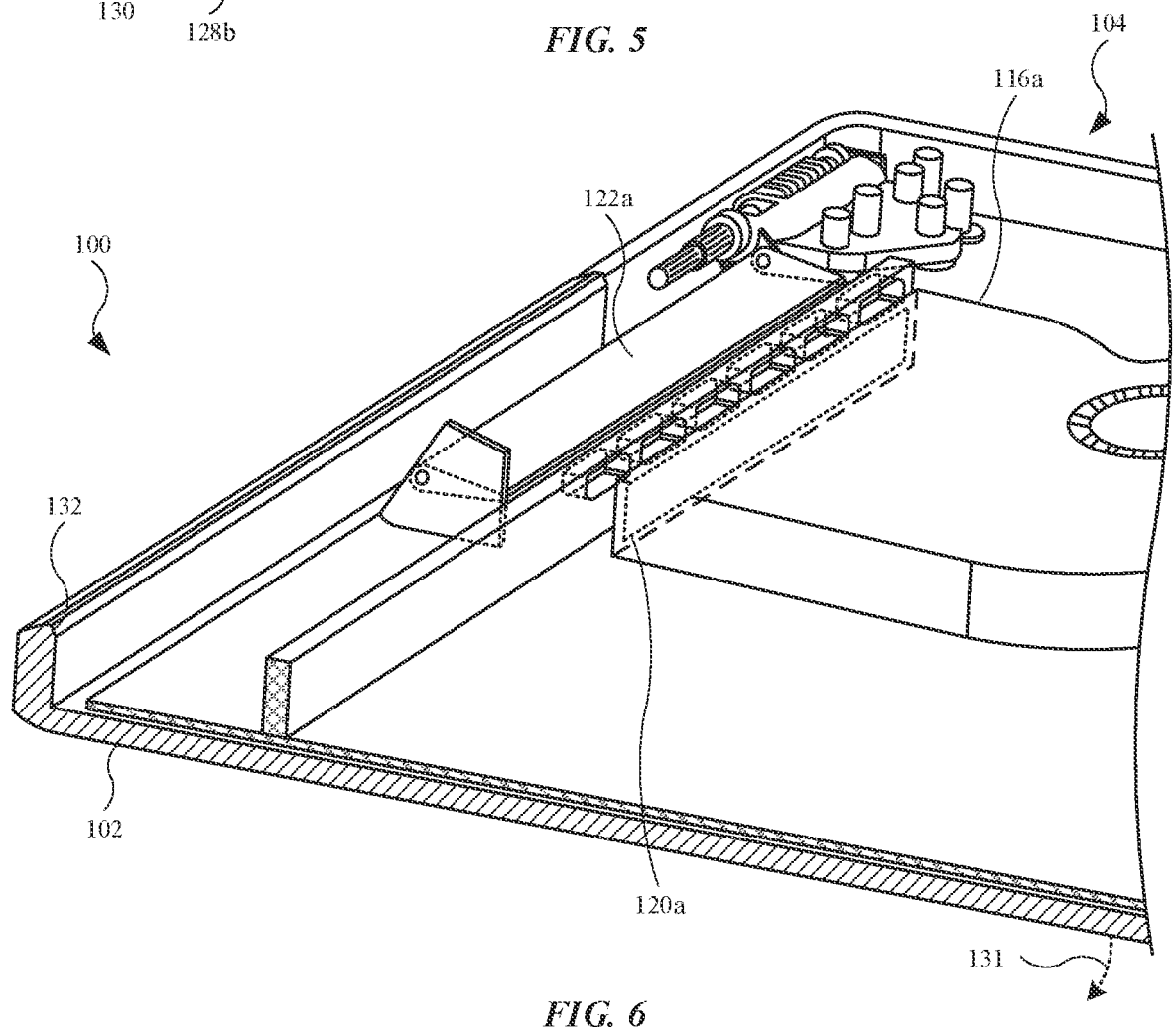
FIG. 6 illustrates a partial cross sectional view of the electronic device, showing the relationship between the fan and the air diverter.

FIG. 6 illustrates a partial cross sectional view of electronic device 100, showing the relationship between fan 116a and air diverter 122a. As shown, air diverter 122a is positioned in proximity to fan outlet 120a. In this manner, the exhaust air that expelled by fan 116a through fan outlet 120a and vent grill 124a passes to air diverter 122a, where the exhaust air can be directed in a desired manner based upon the position of air diverter 122a. For instance, when display housing 102 is in proximity to base portion 104 (as shown in FIG. 6), air diverter 122a can direct the exhaust air in a particular direction through electronic device 100. However, when display housing 102 is rotated away from base portion 104 (in a direction denoted by an arrow 131), the rotation of display housing 102 causes an extension 132, or protrusion, of display housing 102 to contact air diverter 122a, thereby causing air diverter 122a to rotate and direct the air in a different direction through electronic device 100. This will be shown and described below. Other exemplary embodiments will show and described additional means for initiating movement of air diverters.

Figure 7:
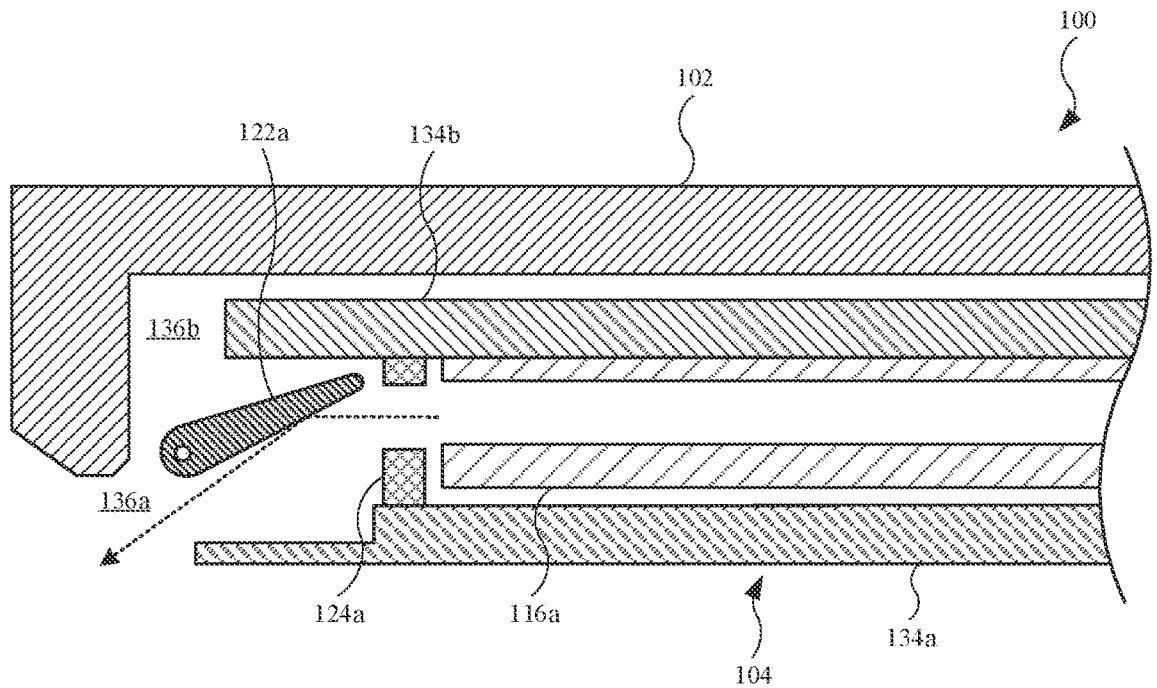
FIG. 7 illustrates a cross sectional view of the electronic device, showing the air diverter directing air from the fan.

FIG. 7 illustrates a cross sectional view of electronic device 100, showing air diverter 122a directing air from fan 116a. As shown, electronic device 100 is in the closed position, and display housing 102 is covering base portion 104. The closed position may define a "zero angle" between display housing 102 and the base portion 104, i.e., the angle between display housing 102 and base portion 104 is equal to zero.

Base portion 104 includes a housing part 134a and a housing part 134b. In some instances, housing parts 134a and 134b are referred to as a first housing part and a second housing part, respectively. Display housing 102 and housing part 134a can define an opening 136a, while display housing 102 and housing part 134b can define an opening 136b. In some instances, openings 136a and 136b are referred to as a first opening and a second opening, respectively. In the closed position of electronic device 100, air diverter 122a is positioned to divert exhaust air (denoted by an arrow) received by fan 116a (through vent grill 124a) to opening 136a, and out of electronic device 100 via opening 136a. Also, although electronic device 100 is in the closed position and in some instances not associated with an operating mode, electronic device 100 may nonetheless be operational, and accordingly fan 116a is also operational. For example, at least one instance of electronic device 100 being operational in the closed position is when one or more displays (not shown) are connected to electronic device 100 by ports 112a and 112b (shown in FIG. 1), and electronic device 100 is in use with an external keyboard and mouse (not shown).

Figure 8:
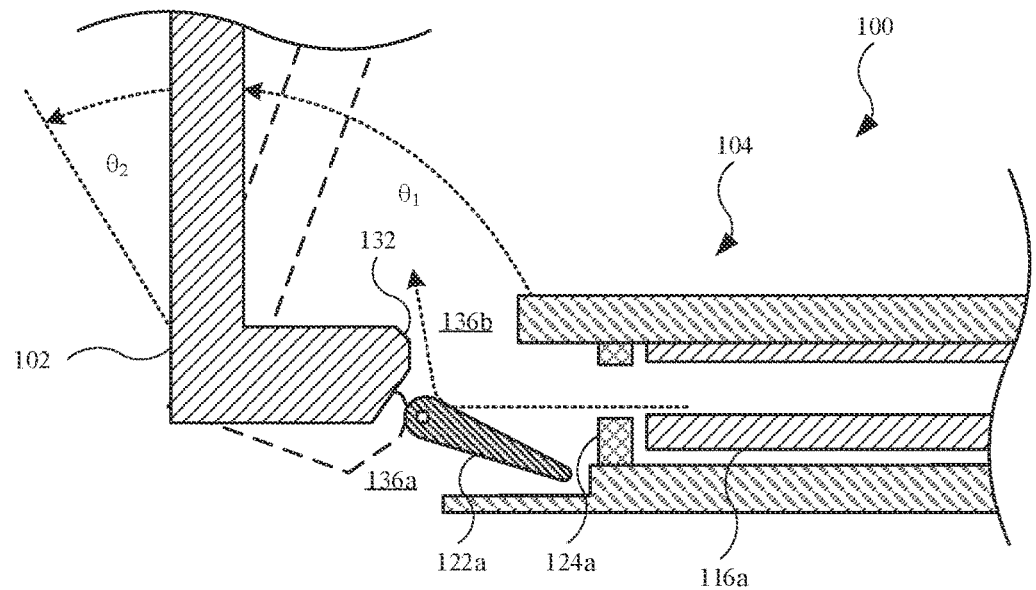
FIG. 8 illustrates a cross sectional view of the electronic device shown in FIG. 7, showing the display housing rotated away from the base portion.

FIG. 8 illustrates a cross sectional view of electronic device 100 shown in FIG. 7, showing display housing 102 rotated away from base portion 104. As shown, electronic device 100 is in an open position, and display housing 102 is positioned at an angle $\theta_1$ from base portion 104. Angle $\theta_1$ is approximately 90 degrees, or at least approximately 90 degrees. Angle $\theta_1$ is an exemplary angle defining an open position, and other angles are possible. For instance, display housing 102 can be further rotated by an angle $\theta_2$. Angle $\theta_2$ is approximately in the range of 20 to 45 degrees, such that display housing 102 can be rotated away from base portion 104 by an angle of 110 to 135 degrees.

The rotation of display housing 102 from the closed position to an open position can cause extension 132 of display housing 102 to engage air diverter 122a, thereby rotating/moving air diverter 122a. As shown, display housing 102 is rotated in a counterclockwise manner, which causes a corresponding clockwise rotation of air diverter 122a. As a result of the rotation of air diverter 122a, air diverter 122a is positioned to direct exhaust air (denoted by an arrow) received by 116a (through vent grill 124a) to opening 136b, and out of electronic device 100 via opening 136b. It should be noted that additional rotation of display housing 102 by, for example, by angle $\theta_2$ will not result in additional contact between extension 132 and air diverter 122a, and accordingly air diverter 122a will not undergo additional rotation. However, rotation/movement of display housing 102 from an open position to the closed position (shown in FIG. 7) causes extension 132 to again engage air diverter 122a, thereby causing air diverter 122a to rotate back to the position shown in FIG. 7, and air diverter 122a can again direct exhaust air to opening 136a.

FIGS. 7 and 8 show and describe movement for air diverter 122a based on movement of display housing 102. Redirecting heated exhaust air from fan 116a through a particular opening based upon the position of display housing 102 relative to base portion 104 offers several advantages. For example, when electronic device 100 is in the closed position (shown in FIG. 7), there is a relatively small air gap between display housing 102 and base portion 104. As a result, directing exhaust air (by air diverter 122a) through opening 136a provides a means for directing air away from the small gap defined by display housing 102 and base portion 104, thereby creating a more efficient exit pathway for the exhaust air. Conversely, in an open position (shown in FIG. 8), air diverter 122a is rotated and positioned to direct air through opening 136b. When electronic device 100 (in particular, housing part 134a) is placed on a surface or a user's lap, the exhaust air is directed away from the surface to provide a more efficient exit pathway, or in the case of the user, the exhaust air is directed away from the user to reduce or prevent injury to the user from the exhaust air. It should be noted that air diverter 122b (shown in FIG. 3) can rotate/move in the manner as that shown and described for air diverter 122a.

Figure 9:
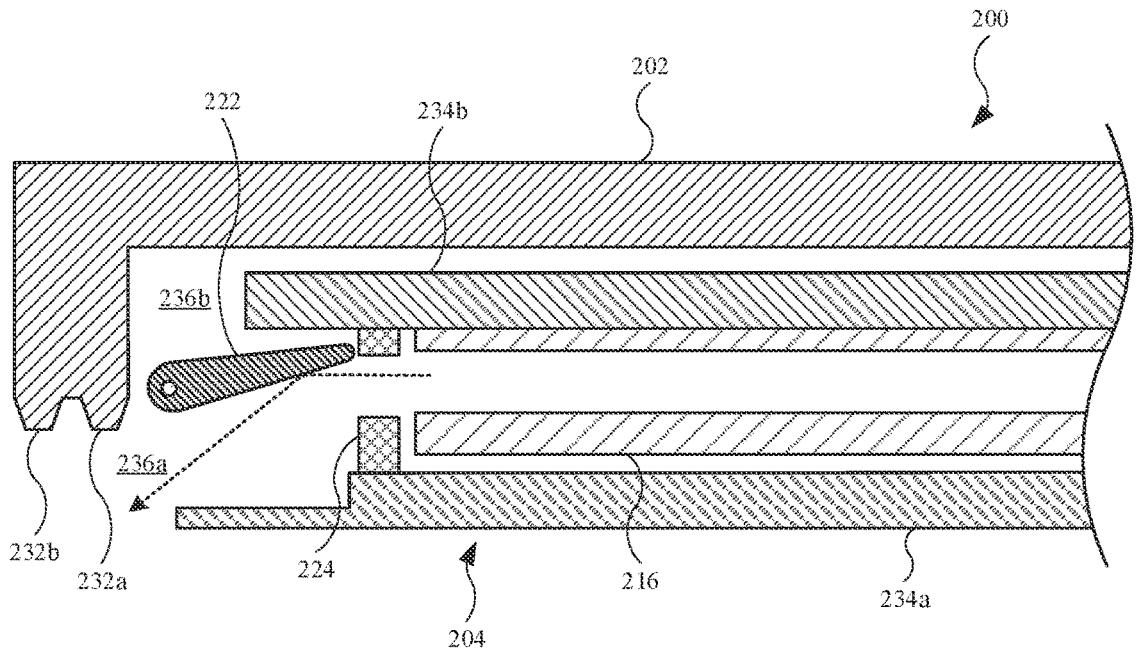
FIG. 9 illustrates a cross sectional view of an alternate embodiment of an electronic device, showing modifications to a display housing.

FIG. 9 illustrates a cross sectional view of an alternate embodiment of an electronic device 200, showing modifications to a display housing 202 of electronic device 200. Electronic device 200 may include several features previously shown and described for electronic devices. In addition to display housing 202, electronic device 200 further includes a base portion 204 rotationally coupled to display housing 202. Base portion 204 can be defined in part by a housing part 234a and a housing part 234b. Base portion 204 carries a fan 216 (between housing part 234a and housing part 234b) designed to drive heated air out of electronic device 200. Additionally, base portion 204 carries an air diverter 222 designed to direct air received by fan 216 that passes through a vent grill 224. Air diverter 222 can direct air through an opening 236a (defined by display housing 202 and housing part 234a) or an opening 236b (defined by display housing 202 and housing part 234b). As shown, electronic device 200 is in the closed position, and air diverter 222 is positioned to drive air (represented by an arrow) through opening 236a. In order to rotate/move air diverter 222, display housing 202 may include an extension 232a and an extension 232b. Each of extensions 232a and 232b is designed to contact air diverter 222 based upon a position/angle of display housing 202 relative to base portion 204.

Figure 10:
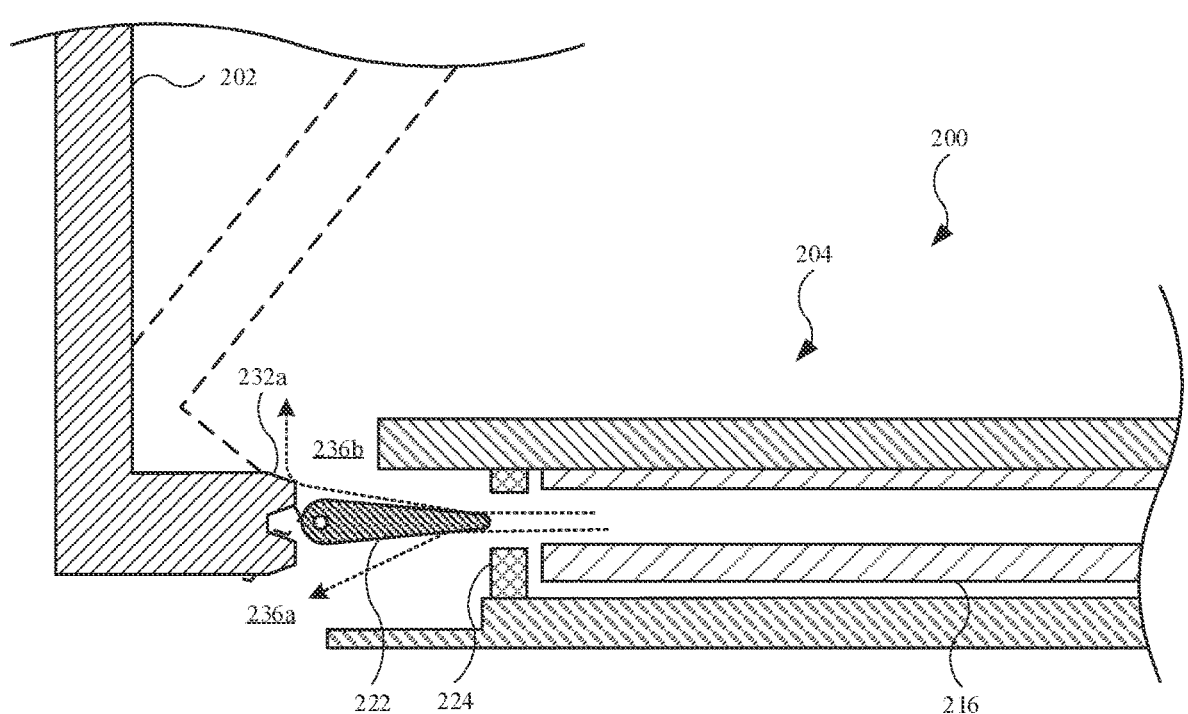
FIG. 10 illustrates a cross sectional view of the electronic device shown in FIG. 9, showing the display housing rotated away from the base portion.

FIG. 10 illustrates a cross sectional view of electronic device 200 shown in FIG. 9, showing display housing 202 rotated away from base portion 204. The rotation of display housing 202 from the closed position to an open position causes extension 232a of display housing 202 to engage air diverter 222, thereby rotating air diverter 222. As shown, display housing 202 is rotated in a counterclockwise manner, which causes a corresponding clockwise rotation of air diverter 222. As a result of the rotation of air diverter 222, air diverter 222 is positioned to direct air (denoted by arrows) received by fan 216, via vent grill 224, through opening 236a and opening 236b and out of electronic device 200. As a result of the position of air diverter 222, electronic device 200 provides two distinct pathways for simultaneous expulsion of exhaust air.

Figure 11:
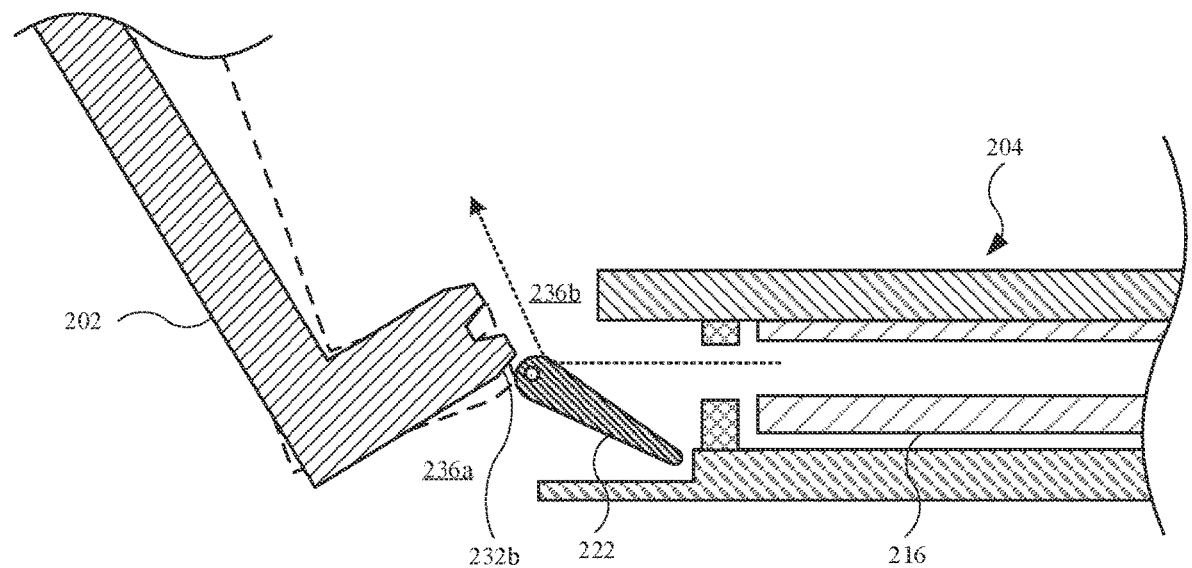
FIG. 11 illustrates a cross sectional view of the electronic device shown in FIG. 10, showing the display housing further rotated away from the base portion.

FIG. 11 illustrates a cross sectional view of electronic device 200 shown in FIG. 10, showing display housing 202 further rotated away from base portion 204. The additional rotation of display housing 202 (in the counterclockwise direction) to an additional open position causes an additional clockwise rotate of display housing 202 such that extension 232b of display housing 202 engages air diverter 222, thereby further rotating air diverter 222. As a result of the rotation of air diverter 222, air diverter 222 is positioned to direct air (denoted by an arrow) received by fan 216 through opening 236b and out of electronic device 200. As a result of the position of air diverter 222, little or no heated exhaust air passes through opening 236a.

It should be noted that clockwise rotation of display housing 202 to the open position (shown in FIG. 10) causes air diverter 222 to rotate back to the position shown in FIG. 10, and additional clockwise rotation of display housing 202 to the closed position (shown in FIG. 9) causes air diverter 222 to rotate back to the position shown in FIG. 9.

The prior embodiments show and describe discrete movements of the air diverter. In other words, the air diverter is designed to move to a particular number of positions. However, in some embodiments, the air diverter is in direct engagement with a structure that is coupled to the display housing. As a result, the air diverter continuously moves in accordance with movement of the display housing. FIGS. 12-19 show and described embodiments in which the air diverter exhibits continuous movement. Additionally, while electronic devices with a single fan and a single air diverter are shown and described, the embodiments in FIGS. 12-19 may include at least two fans and at least two air diverters.

Figure 12:
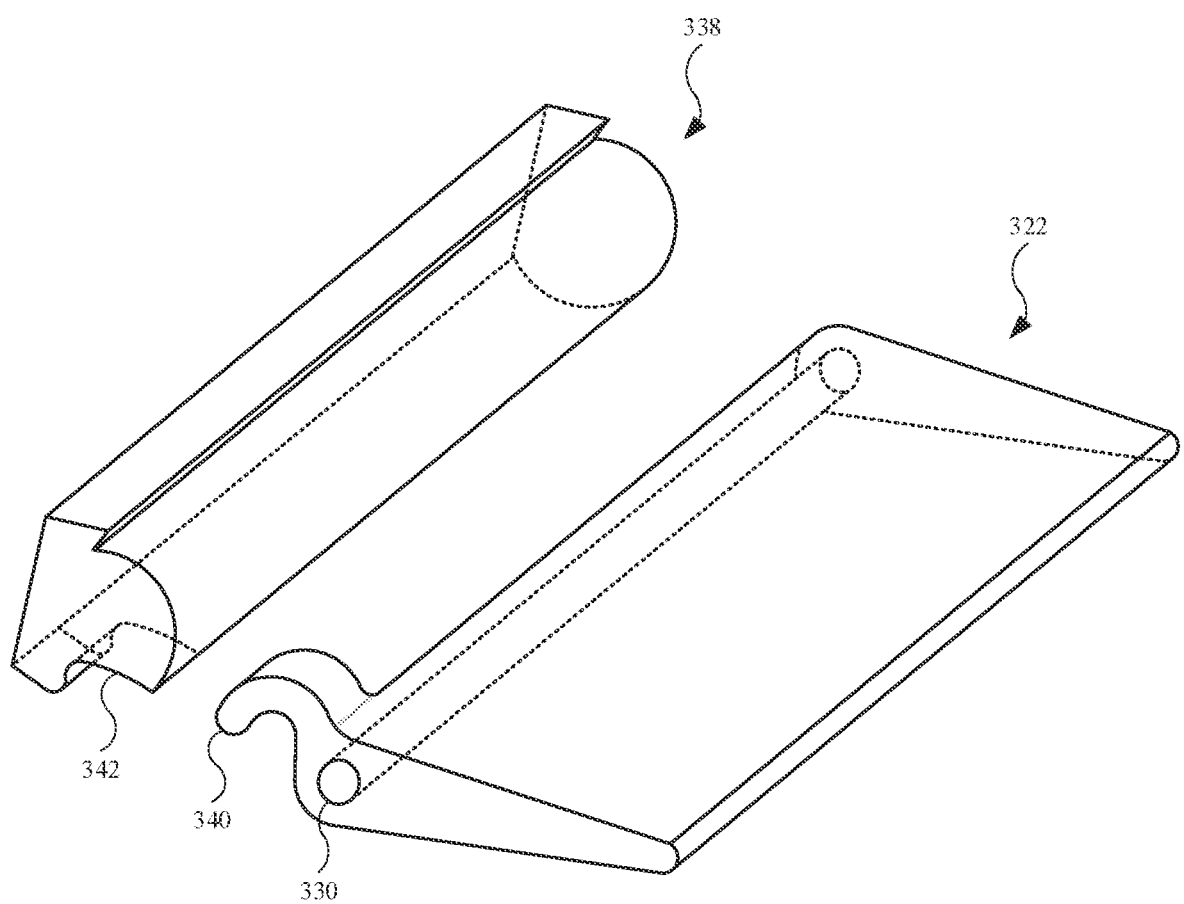
FIG. 12 illustrates an isometric view of an embodiment of an air diverter and a mount used with the air diverter.

FIG. 12 illustrates an isometric view of an embodiment of an air diverter 322 and a mount 338 used with 322 air diverter. As shown, air diverter 322 includes an extension 340, or hook. Air diverter 322 further includes an opening 330 designed to receive a shaft (not shown in FIG. 12), or alternatively, a shaft through each end of opening 330. Also, mount 338 includes a recess 342. Mount 338 can be secured with a display housing (shown below) in a manner such that mount 338 engages air diverter 322 at recess 342 and extension 340, respectively.

Figure 13:
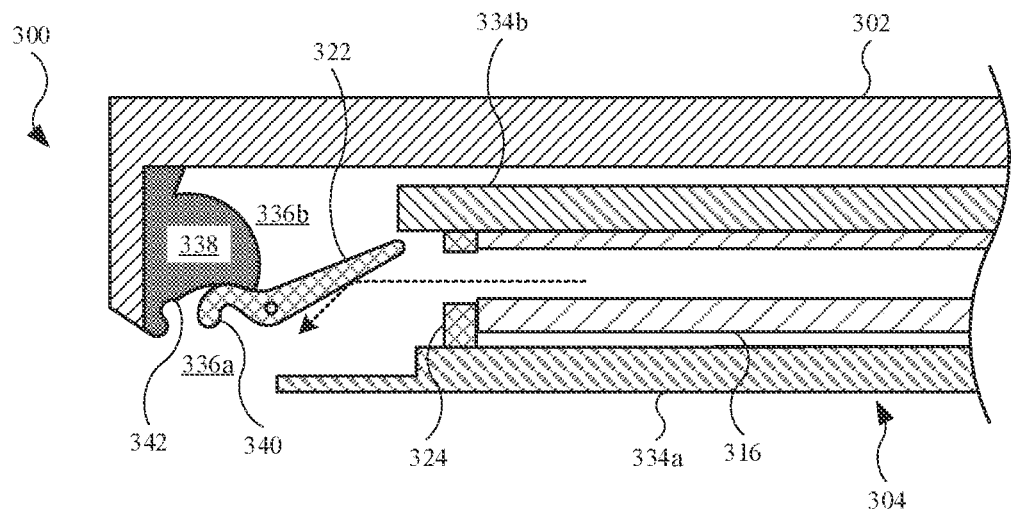
FIG. 13 illustrates a cross sectional view of an embodiment of an electronic device, showing the air diverter and the mount (shown in FIG. 12) integrated with the electronic device.

FIG. 13 illustrates a cross sectional view of an embodiment of an electronic device 300, showing air diverter 322 and mount 338 (shown in FIG. 12) integrated with electronic device 300. Electronic device 300 may include several features previously shown and described for electronic devices. As shown, electronic device 300 includes a display housing 302, and mount 338 is coupled with display housing 302. The securing means may include adhesives, welding, fastening, or soldering, as non-limiting examples. In addition to display housing 302, electronic device 300 further includes a base portion 304 rotationally coupled to display housing 302. Base portion 304 can be defined in part by a housing part 334a and a housing part 334b. Base portion 304 carries a fan 316 (between housing part 334a and housing part 334b) designed to drive heated air out of electronic device 300. Additionally, base portion 304 carries an air diverter 322 designed to direct air received by fan 316 that passes through a vent grill 324. Air diverter 322 can direct air through an opening 336a (defined by display housing 302 and housing part 334a) and/or an opening 336b (defined by display housing 302 and housing part 334b). As shown, electronic device 300 is in the closed position, and air diverter 322 is positioned to drive air (represented by an arrow) through opening 336a.

Figure 14:
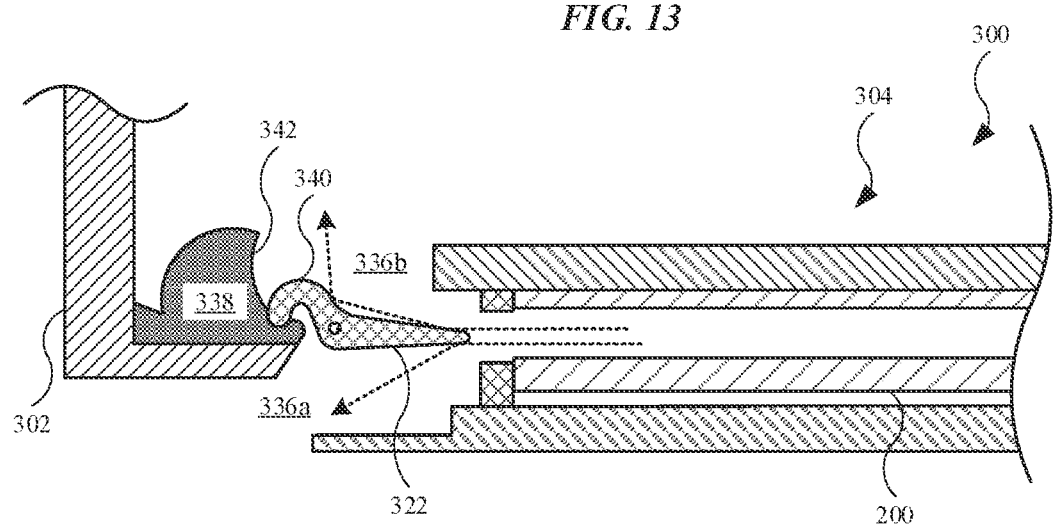
FIG. 14 illustrates a cross sectional view of the electronic device shown in FIG. 13, showing the display housing rotated away from the base portion.

Extension 340 of air diverter 322 is in contact with mount 338 at recess 342 of mount 338. As a result, the rotation of display housing 302 can influence the position of air diverter 322. For example, FIG. 14 illustrates a cross sectional view of electronic device 300 shown in FIG. 13, showing display housing 302 rotated away from base portion 304. As shown, display housing 302 rotates from the closed position to an open position, and mount 338 rotates in accordance with the rotation of display housing 302. Display housing 302 is rotated in a counterclockwise manner, which causes a corresponding clockwise rotation of air diverter 322. Due in part to the engagement between mount 338 and air diverter 322, extension 340 of air diverter 322 moves along recess 342 of mount 338 during rotation of display housing 302 and mount 338. As a result of the rotation of air diverter 322, air diverter 322 is positioned to direct air (denoted by arrows) received by fan 316 through opening 336a and opening 336b, and out of electronic device 300. As a result of the position of air diverter 322, electronic device 300 provides two distinct pathways for simultaneous expulsion of the exhaust air.

Figure 15:
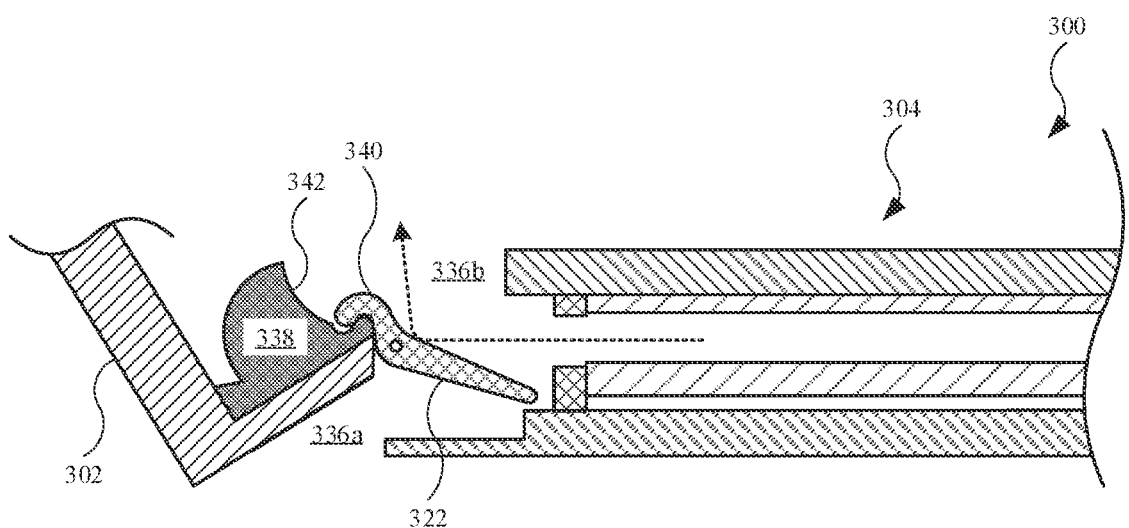
FIG. 15 illustrates a cross sectional view of the electronic device shown in FIG. 14, showing the display housing further rotated away from the base portion.

FIG. 15 illustrates a cross sectional view of electronic device 300 shown in FIG. 14, showing display housing 302 further rotated away from base portion 304. The additional rotation of display housing 302 in the counterclockwise direction causes additional clockwise rotation of air diverter 322. In particular, extension 340 of air diverter 322 moves further along recess 342 of mount 338, thereby causing further clockwise rotation the air diverter 322. As a result of the rotation of air diverter 322, air diverter 322 is positioned to direct air (denoted by an arrow) received by fan 316 through opening 336b and out of electronic device 300, and little or no heated exhaust air passes through opening 336a. It should be noted that clockwise rotation of display housing 302 can cause air diverter 322 to rotate back to the respective positions shown in FIGS. 13 and 14.

Figure 16:
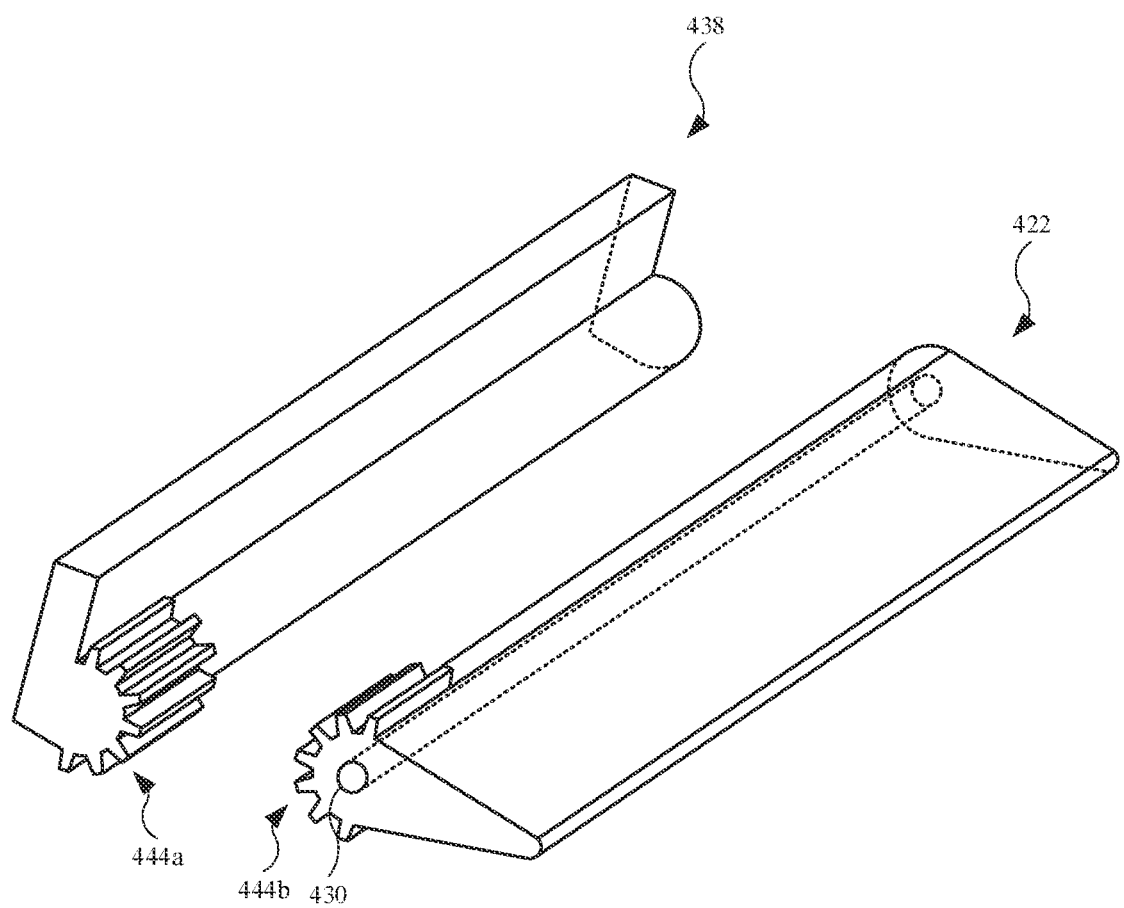
FIG. 16 illustrates an isometric view of an embodiment of an air diverter and a mount used with the air diverter.

FIG. 16 illustrates an isometric view of an embodiment of an air diverter 422 and a mount 438 used with air diverter 422. As shown, mount 438 and air diverter 422 include a gear 444a and a gear 444b, respectively. Gears 444a and 444b may be referred to as a first gear and a second gear, respectively. Air diverter 422 further includes an opening 430 designed to receive a shaft (not shown in FIG. 16), or alternatively, a shaft through each end of opening 430. Mount 438 can be secured with a display housing (shown below) in a manner such that mount 438 engages air diverter 422 by way of gears 444a and 444b, respectively.

Figure 17:
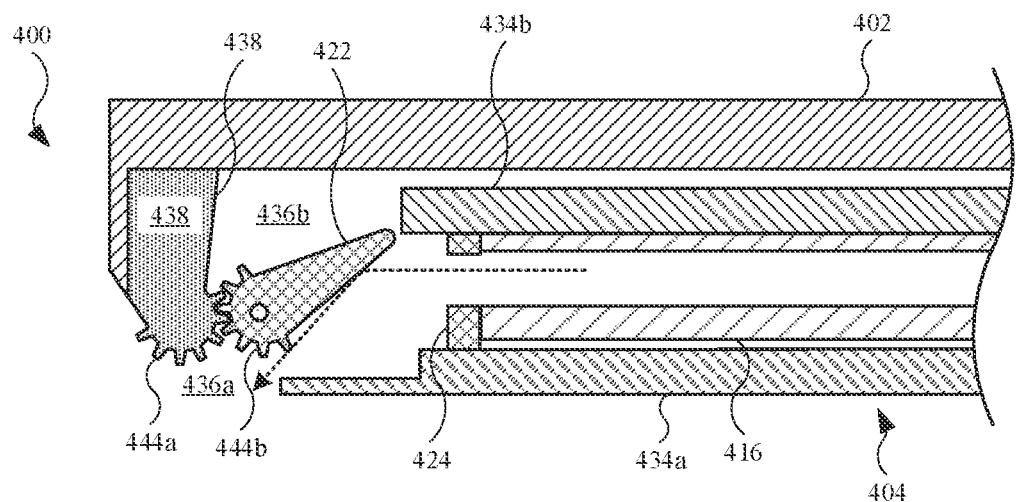
FIG. 17 illustrates a cross sectional view of an embodiment of an electronic device, showing the air diverter and the mount (shown in FIG. 16) integrated with the electronic device.

FIG. 17 illustrates a cross sectional view of an embodiment of an electronic device 400, showing air diverter 422 and mount 438 (shown in FIG. 16) integrated with electronic device 400. Electronic device 400 may include several features previously shown and described for electronic devices. As shown, electronic device 400 includes a display housing 402, and mount 438 is coupled with display housing 402. The securing means may include adhesives, welding, fastening, or soldering, as non-limiting examples. In addition to display housing 402, electronic device 400 further includes a base portion 404 rotationally coupled to display housing 402. Base portion 404 can be defined in part by a housing part 434a and a housing part 434b. Base portion 404 carries a fan 416 (between housing part 434a and housing part 434b) designed to drive heated air out of electronic device 400. Additionally, base portion 404 carries an air diverter 422 designed to direct air received by fan 416 that passes through a vent grill 424. Air diverter 422 can direct air through an opening 436a (defined by display housing 402 and housing part 434a) and/or an opening 436b (defined by display housing 402 and housing part 434b). As shown, electronic device 400 is in the closed position, and air diverter 422 is positioned to drive air (represented by an arrow) through opening 436a.

Also, gear 444a of mount 438 is coupled, or in a geared relationship, with gear 444b of air diverter 422. As a result, rotation of display housing 402 can influence the position of air diverter 422. For example, FIG. 14 illustrates a cross sectional view of electronic device 400 shown in FIG. 14, showing display housing 402 rotated away from base portion 404. As shown, display housing 402 rotates from the closed position to an open position, and mount 438 rotates in accordance with the rotation of display housing 402. Based on the coupled/geared relationship between gears 444a and 444b, display housing 402 is rotated in a counterclockwise manner, which causes a corresponding clockwise rotation of air diverter 422. As a result of the rotation of air diverter 422, air diverter 422 is positioned to direct air (denoted by arrows) received by fan 416 through opening 436a and opening 436b and out of electronic device 400. As a result of the position of air diverter 422, electronic device 400 provides two distinct pathways for simultaneous expulsion of the exhaust air.

Figure 18:
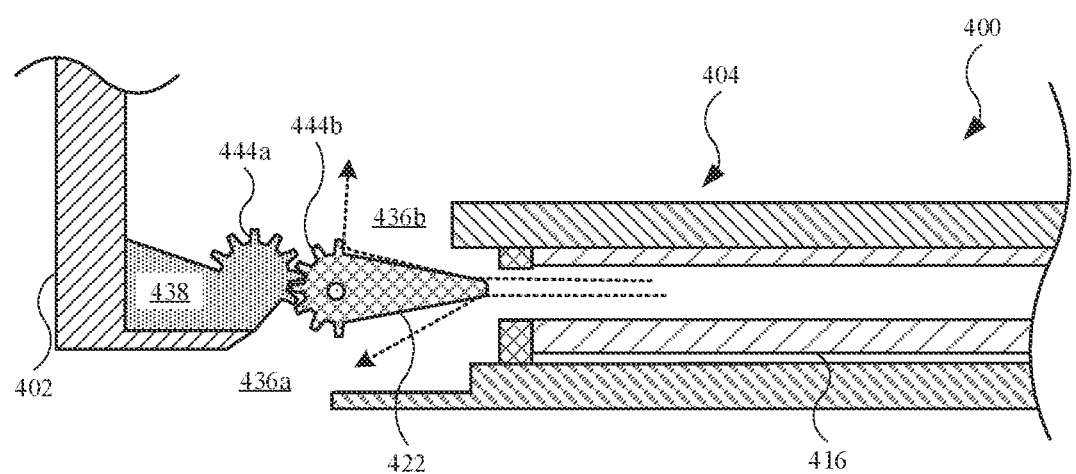
FIG. 18 illustrates a cross sectional view of the electronic device shown in FIG. 17, showing the display housing rotated away from the base portion.
Figure 19:
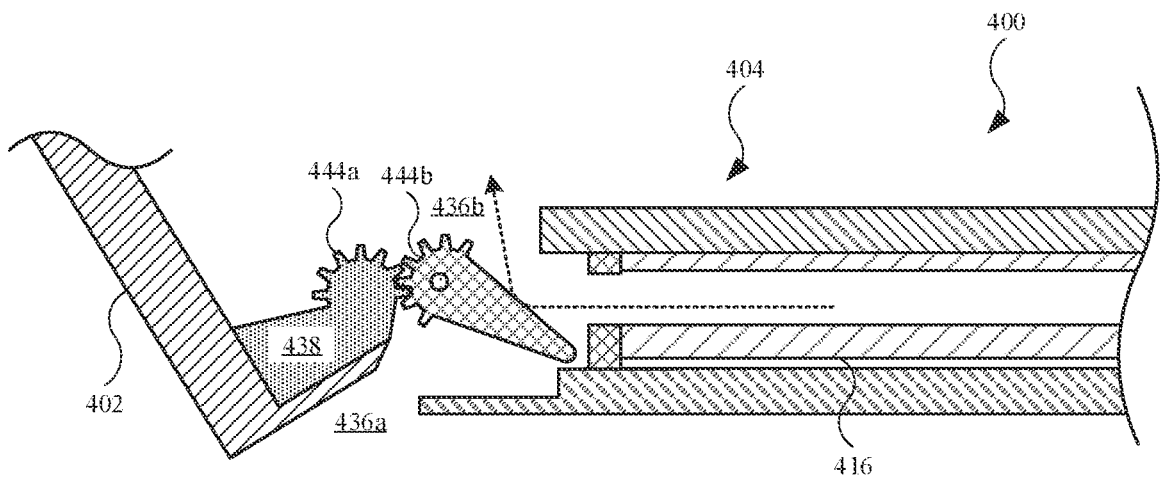
FIG. 19 illustrates a cross sectional view of the electronic device shown in FIG. 18, showing the display housing further rotated away from the base portion.

FIG. 19 illustrates a cross sectional view of electronic device 400 shown in FIG. 18, showing display housing 402 further rotated away from base portion 404. The additional rotation of display housing 402 (in the counterclockwise direction) to an additional open position causes an additional clockwise rotate of air diverter 422. In particular, additional counterclockwise rotation of gear 444a causes additional clockwise rotation of gear 444b of air diverter 422, thereby causing further clockwise rotation of air diverter 422. As a result of the rotation of air diverter 422, air diverter 422 is positioned to direct air (denoted by an arrow) received by fan 416 through opening 436b and out of electronic device 400, and little or no heated exhaust air passes through opening 436a. It should be noted that clockwise rotation of display housing 402 can cause air diverter 422 to rotate back to the respective positions shown in FIGS. 17 and 18.

Figure 20:
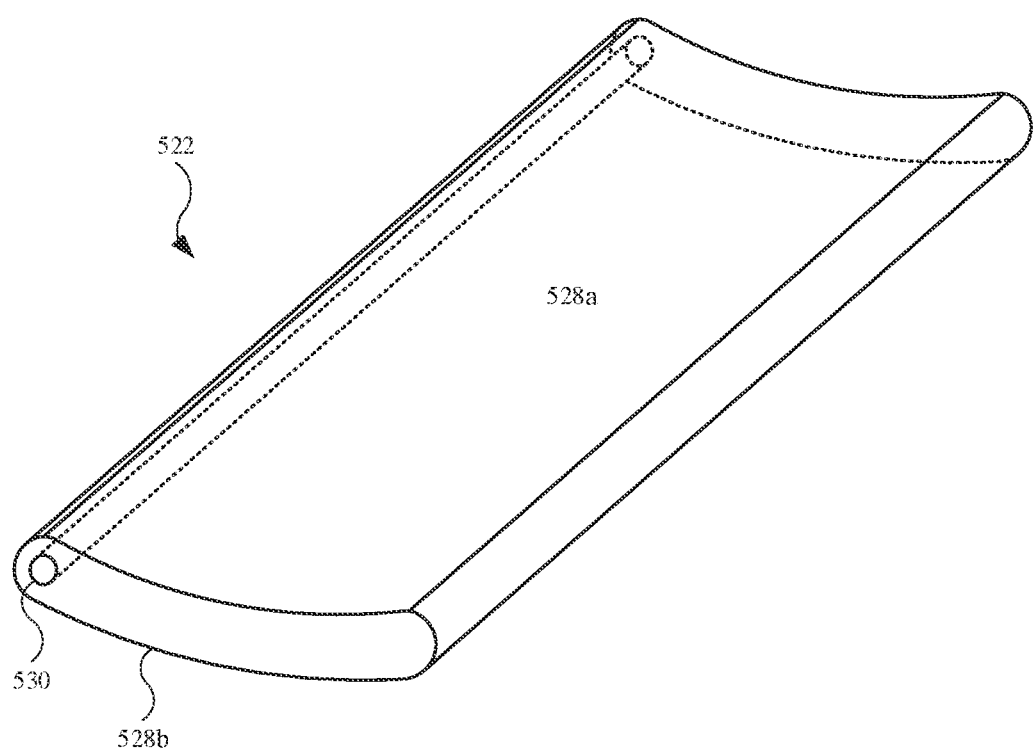
FIG. 20 illustrates an isometric view of an embodiment of an air diverter.

FIG. 20 illustrates an isometric view of an embodiment of an air diverter 522. As shown, air diverter 522 may include multiple air diversion surfaces, such as an air diversion surface 528a and an air diversion surface 528b. Air diversion surface 528a includes a concave surface, while air diversion surface 528b includes a convex surface. As a result, air diversion surfaces 528a and 528b are parallel to each other. Air diverter 522 can be integrated with electronic devices previously shown. For example, air diverters with features shown and described for air diverter 522 can replace air diverter 122a and air diverter 122b (shown in FIG. 3). Also, air diverter 522 includes an opening 530 designed to receive a shaft (not shown in FIG. 20), or alternatively, a shaft through each end of opening 530.

The prior embodiments show and described movement of the air diverter based upon some physical or mechanical connection or engagement (direct or indirect) between the air diverter and the display housing. As a result, the air diverter is passively driven based on movement of the display housing. However, in some embodiments (shown and described below), the air diverter can be actively driven by means other than engagement by a display housing.

Figure 21:
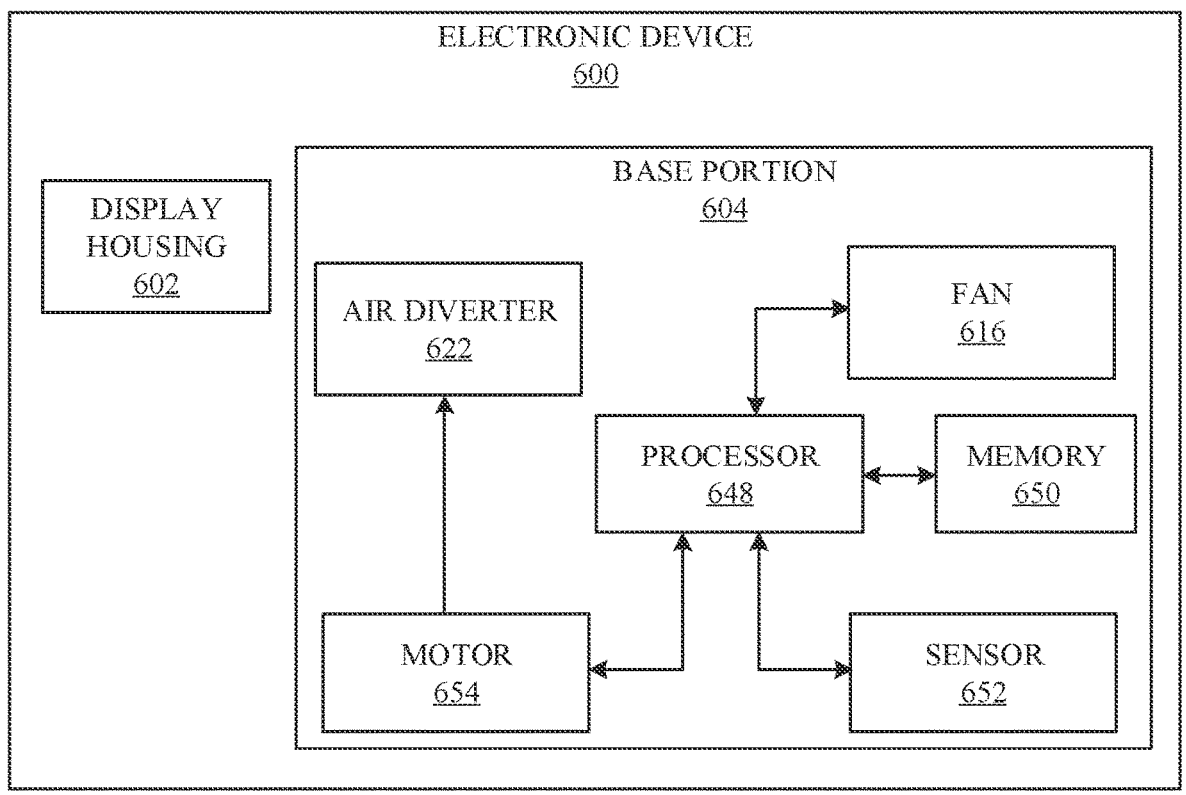
FIG. 21 illustrates a schematic diagram of an alternate embodiment of an electronic device, showing additional features used to drive an air diverter of the electronic device.

FIG. 21 illustrates a schematic diagram of an alternate embodiment of an electronic device 600, showing additional features used to drive an air diverter 622 of electronic device 600. Electronic device 600 may include several features previously shown and described for electronic devices. For example, electronic device 600 may include a display housing 602 and a base portion 604 rotationally coupled to display housing 602. Electronic device 600 may further include a fan 616 located in base portion 604. Air diverter 622 may include at least one air diverter shown in prior embodiments for an electronic device.

Also, electronic device 600 includes a processor 648 designed to execute one or more programs or algorithms stored on memory 650, which may include Random-Access Memory ("RAM") or Read-Only Memory ("ROM"). Electronic device 600 may further include a sensor 652. In some embodiments, sensor 652 is a temperature sensor, such as a thermistor or a thermocouple (as non-limiting examples). Sensor 652 is located in base portion 604. In particular, sensor 652 may be located at or near an exterior surface of base portion 604. In this manner, when sensor 652 is a temperature sensor, sensor 652 can determine the temperature of the exterior surface of base portion 604, and provide temperature information to processor 648. Processor 648 can determine the presence of a user by comparing the temperature, as determined by sensor 652, with a temperature range commonly associated with a human being. Accordingly, processor 648 can determine, using the temperature, that electronic device 600 is positioned on the user, such as the user's lap.

When a determination is made by processor 648 that electronic device 600 is on the user's lap, it is generally beneficial to ensure the heated exhaust air is directed out of electronic device 600 away from the user. In this regard, electronic device 600 may further include a motor 654 connected to air diverter 622. Motor 654 may include a direct current ("DC") motor, including a brushless DC motor or a stepper motor (as non-limiting examples). When processor 648 determines electronic device 600 is positioned on the user, processor 648 can command/instruct motor 654 to rotate/move air diverter 622 in a manner such that air diverter 622 will direct heated exhaust air from fan 616 out of electronic device 600 away from the user. Alternatively, sensor 652 can monitor the temperature of one or more components (not shown in FIG. 21) within base portion 604, and processor 648 can use the temperature information from sensor 652 to control motor 654 to direct air diverter 622 in a particular manner, such as away from the user.

Figure 22:
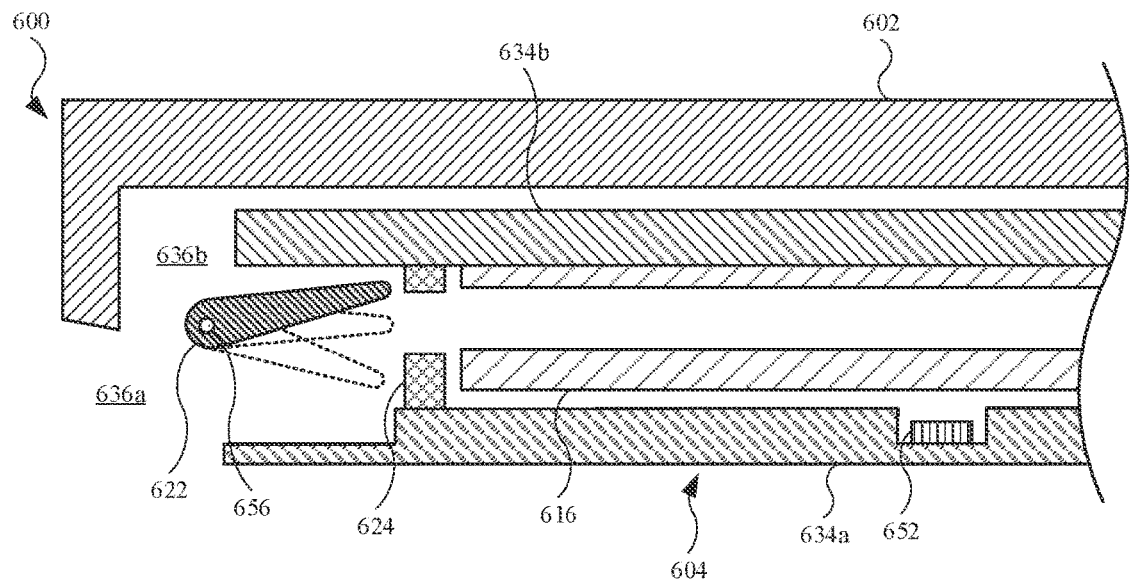
FIG. 22 illustrates a cross sectional view of the electronic device shown in FIG. 21, showing the air diverter and the sensor integrated with the electronic device.

FIG. 22 illustrates a cross sectional view of electronic device 600 shown in FIG. 21, showing air diverter 622 and sensor 652 integrated with electronic device 600. As shown, base portion 604 is defined in part by a housing part 634a and a housing part 634b. Base portion 604 carries a fan 616 (between housing part 634a and housing part 634b) designed to drive heated air out of electronic device 600.

Air diverter 622 is designed to direct air received by fan 616 that passes through a vent grill 624. Air diverter 622 can direct air through an opening 636a (defined by display housing 602 and housing part 634a) and/or an opening 636b (defined by display housing 602 and housing part 634b). In this regard, air diverter 622 is connected to a shaft 656 that is coupled to motor 654 (shown in FIG. 21). Sensor 652 is integrated with housing part 634a in a manner such that when sensor 652 includes a temperatures sensor, sensor 652 can determine the temperature of an exterior surface of housing part 634a and provide the temperature information to processor 648 (shown in FIG. 21). Motor 654, when directed by processor 648 (shown in FIG. 21), can drive shaft 656, which in turn rotates/moves air diverter 622. Unlike prior embodiments, air diverter 622 is driven by motor 654. As shown by the dotted lines, air diverter 622 can be positioned in one of several positions based on motor 654. Accordingly, electronic device 600 provides an air diverter 622 that is actively controlled, and the position of air diverter 622 is not specifically dependent upon the position of display housing 602.

While electronic device 600 is in the closed position, it may be beneficial to position air diverter 622 such that the heated exhaust air is driven through opening 636a so as to provide a relatively fast and efficient exit for the heated exhaust air out of electronic device 600. Alternatively, it may be beneficial to ensure the air is directed to opening 636b and away from the user of electronic device 600, particularly when electronic device 600 is positioned on the user.

Figure 23:
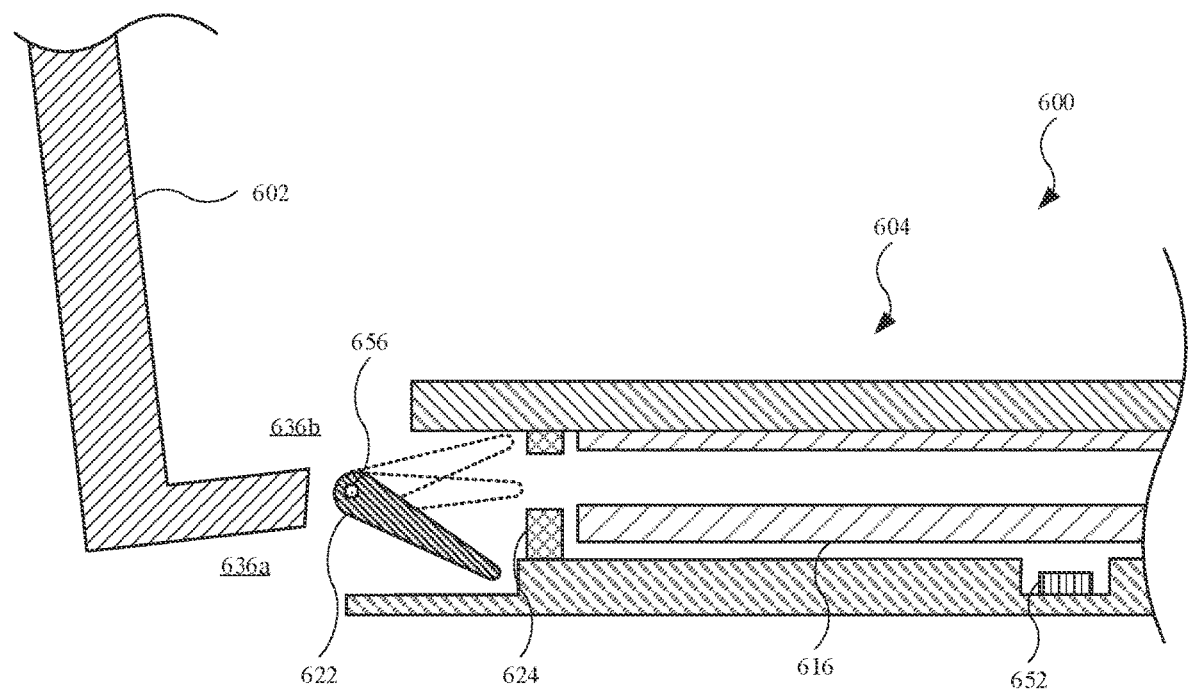
FIG. 23 illustrates a cross sectional view of the electronic device shown in FIG. 22, showing the display housing rotated away from the base portion.

FIG. 23 illustrates a cross sectional view of electronic device 600 shown in FIG. 22, showing display housing 602 rotated away from base portion 604. As shown, display housing 602 rotates from the closed position to an open position. Despite the open position, air diverter 622 can be positioned in one of several positions, as indicated by the dotted lines, based on motor 654 (shown in FIG. 21) driving shaft 656, which in turn rotates air diverter 622. While electronic device 600 is in the open position, it may be beneficial to position air diverter 622 such that the heated exhaust air from fan 616 is driven through opening 636b to ensure the air is directed away from the user of electronic device 600, particularly when electronic device 600 is positioned on the user. Alternatively, it may be beneficial to position air diverter 622 such that the heated exhaust air is driven through opening 636a and opening 636b to provide the heated exhaust air multiple pathways for exiting electronic device 600. Still further, it may be beneficial to position air diverter 622 such that the heated exhaust air is driven through opening 636a such that the heated exhaust air does not extend to, or interfere with, a display (not shown in FIG. 23) carried by display housing 602.

Figure 24:
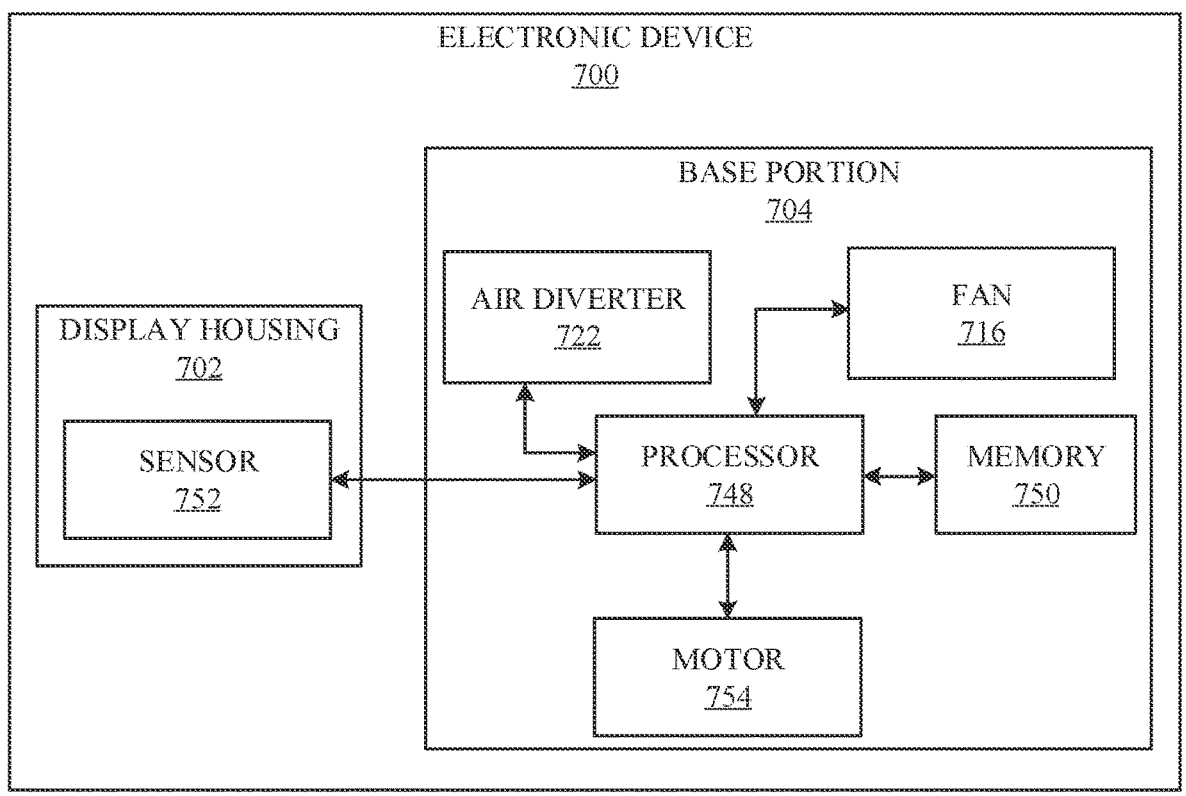
FIG. 24 illustrates a schematic diagram of an alternate embodiment of an electronic device, showing additional features used to drive an air diverter of the electronic device.

FIG. 24 illustrates a schematic diagram of an alternate embodiment of an electronic device 700, showing additional features used to drive an air diverter 722 of electronic device 700. Electronic device 700 may include several features previously shown and described for electronic devices. For example, electronic device 700 may include a display housing 702 and a base portion 704 rotationally coupled to display housing 702. Electronic device 700 may further include a fan 716 located in base portion 704. Air diverter 722 may include at least one air diverter shown in prior embodiments for an electronic device. Also, electronic device 700 includes a processor 748 designed to execute one or more programs or algorithms stored on memory 750, which may include Random-Access Memory ("RAM") or Read-Only Memory ("ROM"). Electronic device 700 may further include a sensor 752. In some embodiments, sensor 752 is an orientation sensor, such as an accelerometer or a geomagnetic sensor (as non-limiting examples). Sensor 752 is located in display housing 702. In this manner, when sensor 752 is an orientation sensor, sensor 752 can determine the position/angle of display housing 702 relative to base portion 704, and provide orientation information to processor 748.

Electronic device 700 may further include a motor 754 connected to air diverter 722. Motor 754 may include a direct current ("DC") motor, including a brushless DC motor or a stepper motor (as non-limiting examples). When processor 748 determines the angle of display housing 702 relative to base portion 704, based upon sensor 752, processor 748 can determine whether the electronic device 700 is in the closed position or the open position, both of which are previously described. Based on the position of display housing 702, it is generally advantageous to orient/position air diverter 722 to direct heated exhaust air from fan 716 in a particular direction. For example, when processor 748 determines electronic device 700 is positioned on the user, processor 748 can a command to motor 754 to rotate/move air diverter 722 in a manner such that air diverter 722 will direct heated exhaust air from fan 716 out of electronic device 700 away from the user.

Figure 25:
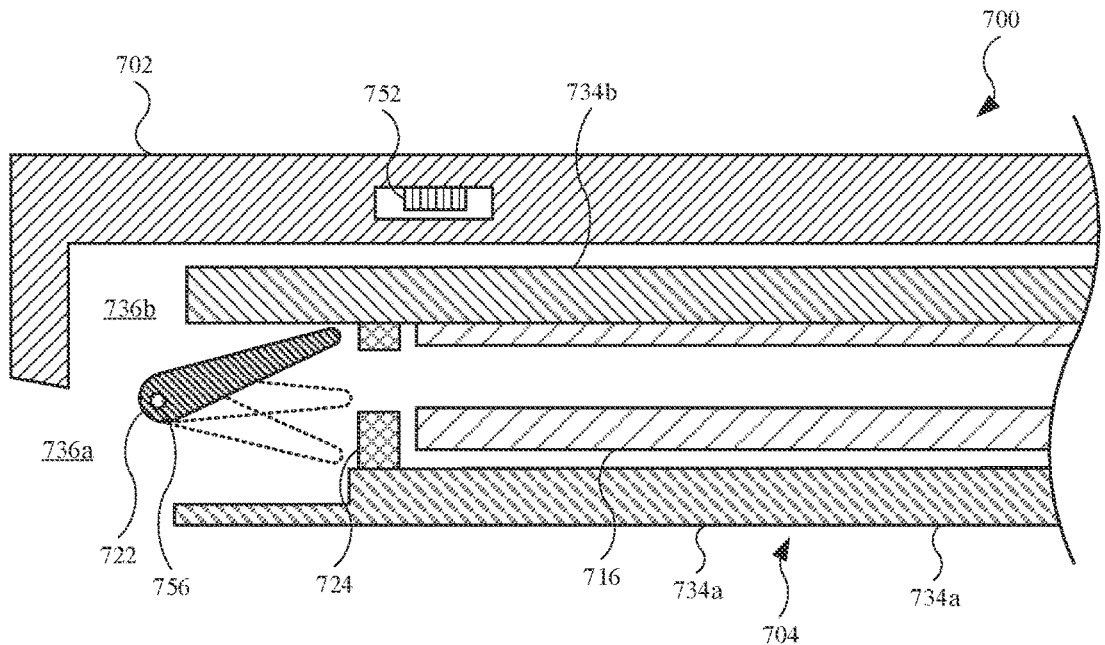
FIG. 25 illustrates a cross sectional view of the electronic device shown in FIG. 24, showing the air diverter and the sensor integrated with the electronic device.

FIG. 25 illustrates a cross sectional view of electronic device 700 shown in FIG. 24, showing air diverter 722 and sensor 752 integrated with electronic device 700. As shown, base portion 704 is defined in part by a housing part 734a and a housing part 734b. Base portion 704 carries a fan 716 (between housing parts 734a and 734b) designed to drive heated air out of electronic device 700.

Air diverter 722 is designed to direct air received by fan 716 that passes through a vent grill 724. Air diverter 722 can direct air through an opening 736a (defined by display housing 702 and housing part 734a) and/or an opening 736b (defined by display housing 702 and housing part 734b). In this regard, air diverter 722 is connected to a shaft 756 that is coupled to motor 754 (shown in FIG. 24). Sensor 752 is integrated with display housing 702 in a manner such that when sensor 752 includes an orientation sensor, sensor 752 can provide orientation information of display housing 702 to processor 748 (shown in FIG. 24). Motor 754, when directed by processor 748 (shown in FIG. 24), can drive shaft 756, which in turn rotates/moves air diverter 722. Similar to air diverter 622 (shown in FIG. 22), air diverter 722 is not driven by contact with display housing 702, but by motor 754. As shown by the dotted lines, air diverter 722 can be positioned in one of several positions based on motor 754. Accordingly, electronic device 700 provides an air diverter 722 that is actively controlled, and the position of air diverter 722 is not specifically dependent upon the position of display housing 702.

Figure 26:
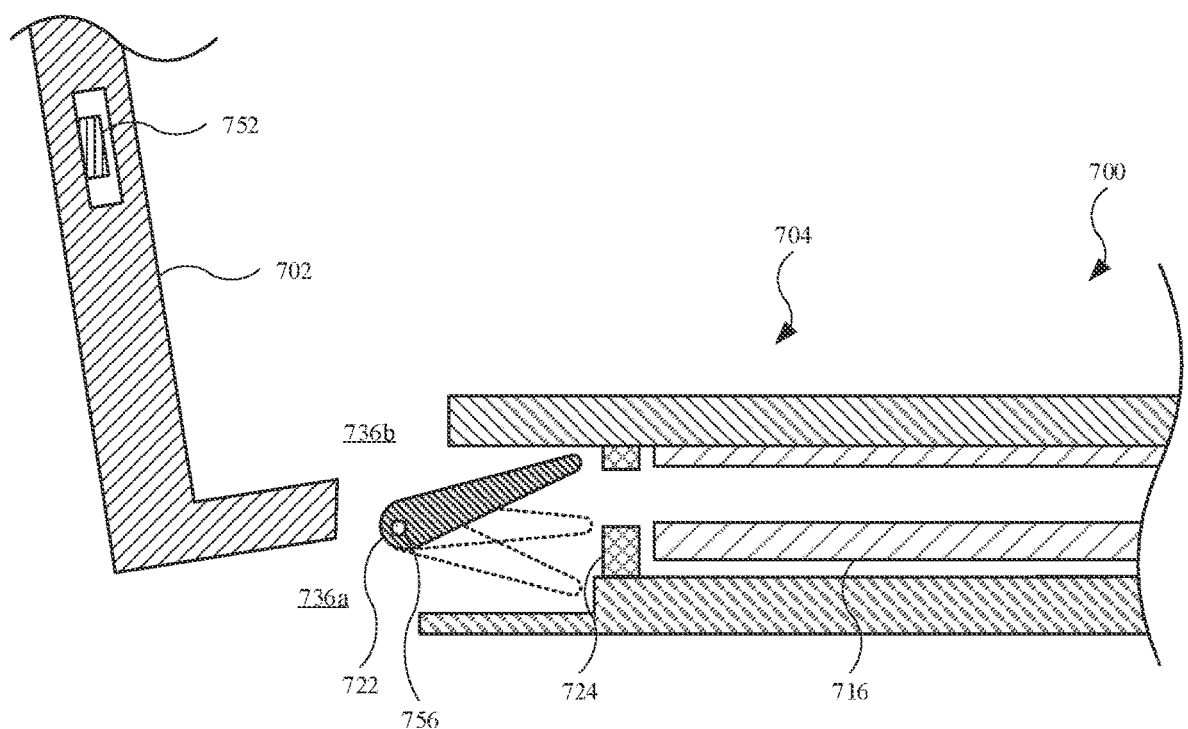
FIG. 26 illustrates a cross sectional view of the electronic device shown in FIG. 25, showing the display housing rotated away from the base portion.

FIG. 26 illustrates a cross sectional view of electronic device 700 shown in FIG. 25, showing display housing 702 rotated away from base portion 704. As shown, display housing 702 rotates from the closed position to an open position. Despite the open position, air diverter 722 can be positioned in one of several positions, as indicated by the dotted lines, based on motor 754 (shown in FIG. 24) driving shaft 756, which in turn rotates air diverter 722. While electronic device 700 is in the open position, it may be beneficial to position air diverter 722 such that the heated exhaust air from fan 716 is driven through opening 736b to ensure the air is directed away from the user of electronic device 700, particularly when electronic device 700 is positioned on the user. Alternatively, it may be beneficial to position air diverter 722 such that the heated exhaust air is driven through opening 736a and opening 736b to provide the heated exhaust air multiple pathways for exiting electronic device 700. Still further, it may be beneficial to position air diverter 722 such that the heated exhaust air is driven through opening 736a such that the heated exhaust air does not extend to, or interfere with, a display (not shown in FIG. 26) carried by display housing 702.

Figure 27:
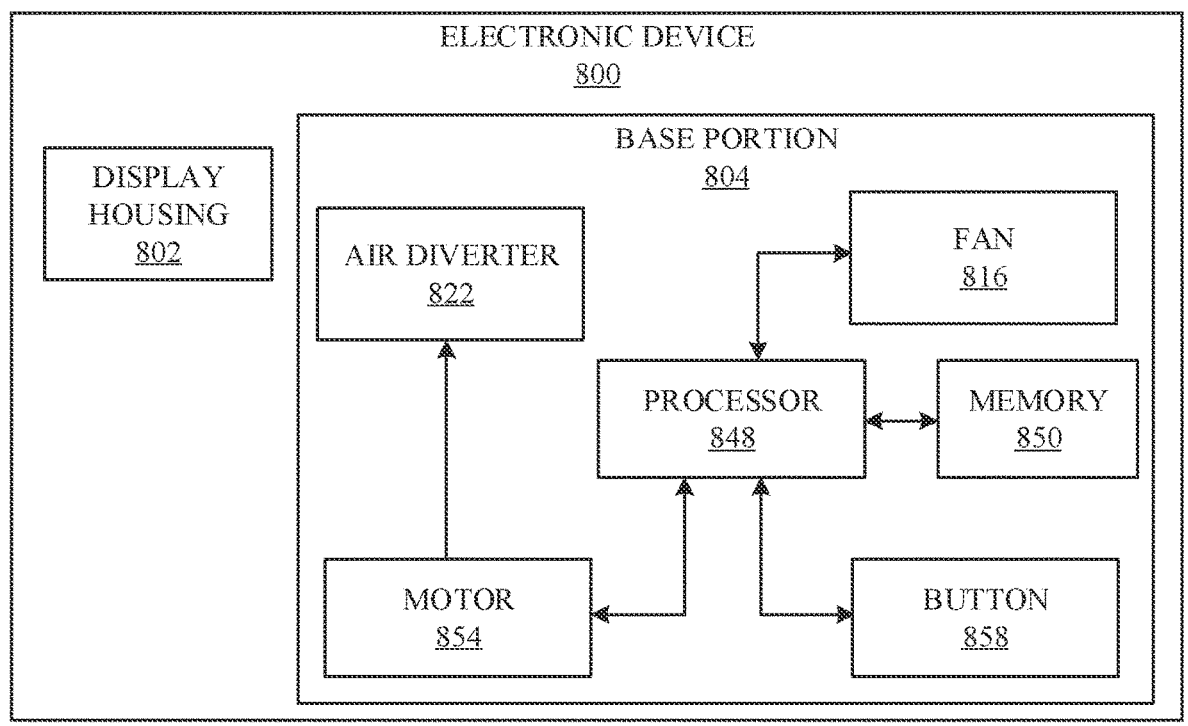
FIG. 27 illustrates a schematic diagram of an alternate embodiment of an electronic device, showing additional features used to drive an air diverter of the electronic device.

FIG. 27 illustrates a schematic diagram of an alternate embodiment of an electronic device 800, showing additional features used to drive an air diverter 822 of the electronic device 800. Electronic device 800 may include several features previously shown and described for electronic devices. For example, electronic device 800 may include a display housing 802 and a base portion 804 rotationally coupled to display housing 802. Electronic device 800 may further include a fan 816 located in base portion 804. Air diverter 822 may include at least one air diverter shown in prior embodiments for an electronic device.

Also, electronic device 800 includes a processor 848 designed to execute one or more programs or algorithms stored on memory 850, which may include Random-Access Memory ("RAM") or Read-Only Memory ("ROM"). Electronic device 800 may further include a button 858. In some embodiments, button 858 is part of a keyboard (not shown in FIG. 27) or a separate button from the keyboard. Button 858 can include a mechanical button or a capacitive sensing input button (as non-limiting examples). Button 858 can be carried by the base portion 804. However, in some embodiments (not shown), button 858 is carried by display housing 802. Button 858 can be operated by a user to control the position of air diverter 822, and accordingly, control the exit location of heated exhaust air (from fan 816) out of electronic device 800. As shown, button 858 can provide an input to processor 848, which in turn can command motor 854 to rotate/move air diverter 822.

Figure 28:
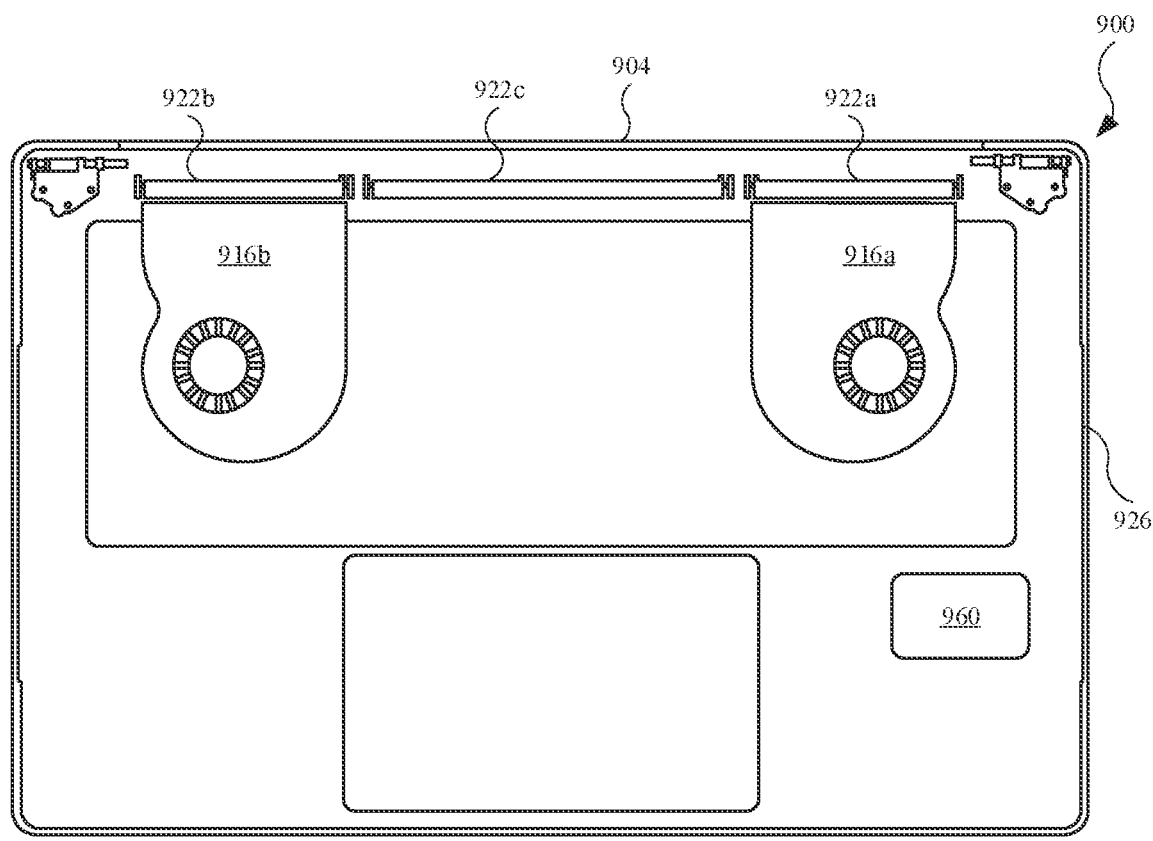
FIG. 28 illustrates a plan view of an alternate embodiment of an electronic device, showing air diverters at both air intake and air exit locations of the electronic device.

The prior embodiments show and describe air diverters used to direct heated exhaust air. However, in some embodiments, an electronic device may include air diverters at both air exhaust and intake locations. FIG. 28 illustrates a plan view of electronic device 900, showing internal features showing air diverters at both air intake and air exit locations of electronic device 900. Electronic device 900 may include any features previously described for an electronic device. As shown, electronic device 900 includes a base portion 904. For purposes of illustration, a housing part of base portion 904 is removed. Base portion 904 includes a fan 916a and a fan 916b. Base portion 904 further includes an air diverter 922a and an air diverter 922b designed to direct heated exhaust air exiting fans 916a and 916b, respectively.

Additionally, base portion 904 includes an air diverter 922c. However, air diverter 922c is designed to direct and regulate ambient airflow into base portion 904 from an opening (not shown in FIG. 28). In order to direct airflow entering base portion 904, air diverter 922c can rotate/move in a manner similar to previous embodiments of air diverters described herein. In order to regulate (e.g., allow, limit, or prevent) ambient airflow into base portion 904, air diverter 922c can rotate/move to block, partially block, or permit the ambient airflow into base portion 904. Each of air diverters 922a, 922b, and 922c may be in proximity to a vent grill, similar to vent grills 124a and 124b (shown in FIG. 5). Accordingly, air diverter 922c may regular airflow received through its respective vent grill (not shown in FIG. 28).

The base portion 904 may include a heat-generating component 960, such as an integrated circuit (as a non-limiting example). As shown, heat-generating component 960 is in proximity to an opening 926 of base portion 904, with opening 926 also designed as an ambient air intake location of base portion 904. In some instances, it may be advantageous to position air diverter 922c to block ambient air into electronic device 900, thereby causing ambient air to be drawn into base portion 904 (by the fan 916a) via opening 926. For example, when heat-generating component 960 is operating in a relatively high power mode (thereby generating a relatively high amount of heat), or when a temperature sensor (not shown in FIG. 28) in base portion 904 determines heat-generating component 960 achieves or exceeds a threshold temperature, air diverter 922c can be positioned/rotated block ambient air into electronic device 900, this forcing the ambient air into electronic device 900 via opening 926. Conversely, when heat-generating component 960 is operating in a low power mode (thereby generating a relatively low amount of heat), or when a temperature sensor in base portion 904 determines heat-generating component 960 is a threshold temperature, air diverter 922c can be positioned/rotated to permit air into base portion 904 such that both air diverter 922c and/or opening 926 can provide an ambient air intake location.

Figure 29:
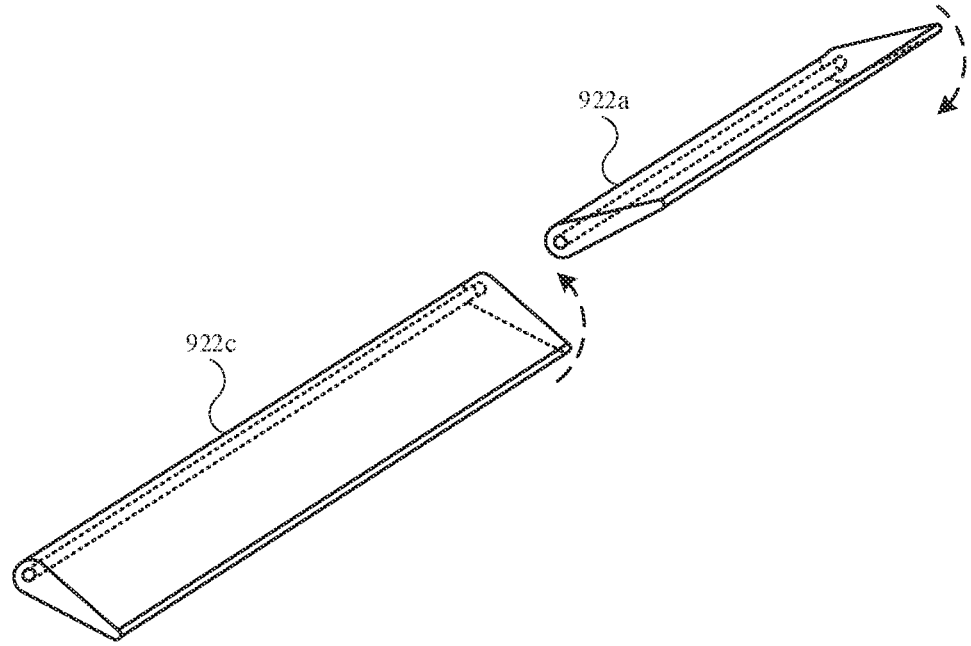
FIG. 29 illustrates an isometric view of the air diverter and the air diverter shown in FIG. 28, showing movement of the air diverter and the air diverter.

Additionally, the position of air diverter 922c may be depend upon the position of air diverters 922a and 922b, or vice versa. For instance, FIG. 29 illustrates an isometric view of air diverters 922a and 922c shown in FIG. 28, showing movement of air diverters 922a and 922c. As shown, air diverters 922a and 922c can take opposing positions. For example, air diverter 922c is in a "down" position while air diverter 922a is in an "up" position. In an alternate configuration (not shown in FIG. 29), air diverter 922c is in an "up" position while air diverter 922a is in a "down" position. This may prevent air diverter 922c from intaking relatively hot exhaust air directed out of electronic device 900 (shown in FIG. 28) via air diverter 922a.

Figure 30:
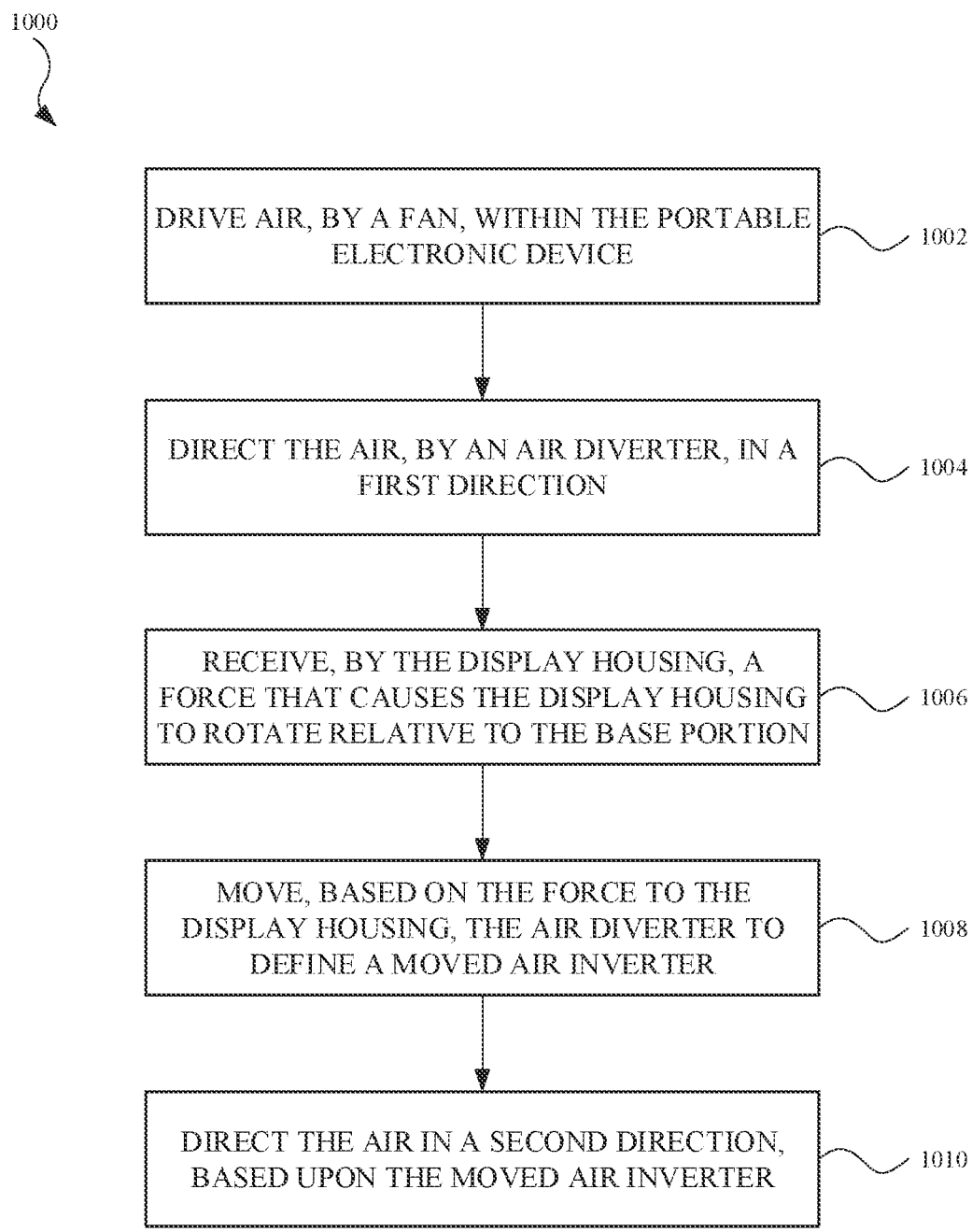
FIG. 30 illustrates a block diagram showing a method for cooling a portable electronic device, in accordance with some described embodiments.

FIG. 30 illustrates a block diagram showing a method 1000 for cooling a portable electronic device, in accordance with some described embodiments. The steps of method 1000 may be implemented by electronic devices described herein.

In step 1002, a fan drives air within the portable electronic device. The air may include ambient air drawn into the portable electronic device by the fan. The fan may include a fan inlet and a fan outlet. In this regard, the air can be used to draw heat away from one or more heat-generating components within the portable electronic device. Accordingly, the ambient air can become heated exhaust air driven through the fan.

In step 1004, the air is directed, by an air diverter, in a first direction. The air diverter may receive air from the fan via the fan outlet. The air may include the heated exhaust air. The first direction may be associated with a direction from the air diverter to an opening formed in the portable electronic device.

In step 1006, the display housing receives a force that causes the display housing to rotate relative to the base portion. The force can rotate the display housing away from the base portion such that the portable electronic device transitions from a closed position to an open position. Conversely, the force can rotate the display housing away from the base portion such that the portable electronic device transitions from the open position to the closed position.

In step 1008, the air diverter is moved, based on the force to the display housing, to define a moved air diverter. In this regard, the air diverter can rotate/move based on rotation of the display housing. In some instances, the air diverter rotates based upon engagement with, or contact by, the display housing. In some instances, the air diverter is coupled with (directly or indirectly) the display housing such that rotation of the display housing causes a corresponding rotation of the air diverter.

In step 1010, the air is directed in a second direction, based upon the moved air diverter. The second direction can be different from the first direction. For instance, the first direction can be associated with a direction toward a first opening of the portable electronic device, and the second direction can be associated with a direction toward a second opening of the portable electronic device. Alternatively, the second direction can be defined by the air diverter positioned to direct air to both the first opening and the second opening of the portable electronic device.

Figure 31:
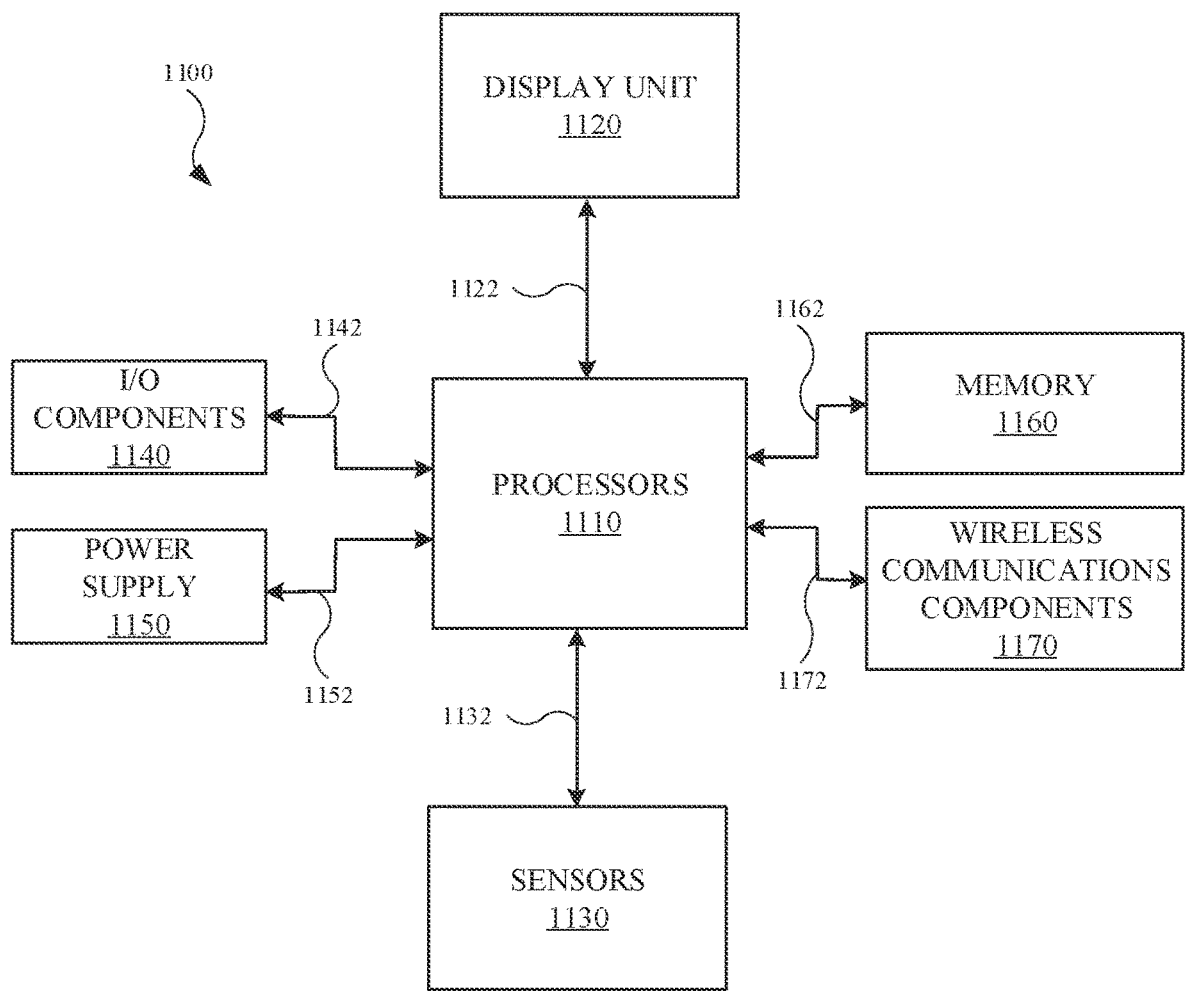
FIG. 31 illustrates a schematic diagram of an electronic device, in accordance with some described embodiments.

FIG. 31 illustrates a block diagram of an electronic device 1100, in accordance with some described embodiments. The features in electronic device 1100 may be present in other electronic devices described herein. Electronic device 1100 may include one or more processors 1110 for executing functions of the electronic device 1100. One or more processors 1110 can refer to at least one of a central processing unit (CPU) and at least one microcontroller for performing dedicated functions. Also, one or more processors 1110 can refer to application specific integrated circuits.

According to some embodiments, electronic device 1100 can include a display unit 1120. Display unit 1120 is capable of presenting a user interface that includes icons (representing software applications), textual images, and/or motion images. In some examples, each icon can be associated with a respective function that can be executed by one or more processors 1110. In some cases, display unit 1120 includes a display layer (not illustrated), which can include a liquid-crystal display (LCD), light-emitting diode display (LED), or the like. According to some embodiments, display unit 1120 includes a touch input detection component and/or a force detection component that can be configured to detect changes in an electrical parameter (e.g., electrical capacitance value) when the user's appendage (acting as a capacitor) comes into proximity with display unit 1120 (or in contact with a transparent layer that covers the display unit 1120). Display unit 1120 is connected to one or more processors 1110 via one or more connection cables 1122.

According to some embodiments, electronic device 1100 can include one or more sensors 1130 capable of provide an input to one or more processors 1110 of electronic device 1100. One or more sensors 1130 may include a temperature sensor, a capacitive sensor, and magnetic field sensors, as a non-limiting example. One or more sensors 1130 is/are connected to one or more processors 1110 via one or more connection cables 1132.

According to some embodiments, electronic device 1100 can include one or more input/output components 1140. In some cases, the one or more input/output components 1140 can refer to a button or a switch that is capable of actuation by the user. When one or more input/output components 1140 are used, one or more input/output components 1140 can generate an electrical signal that is provided to one or more processors 1110 via one or more connection cables 1142.

According to some embodiments, electronic device 1100 can include a power supply 1150 that is capable of providing energy to the operational components of electronic device 1100. In some examples, power supply 1150 can refer to a rechargeable battery. Power supply 1150 can be connected to one or more processors 1110 via one or more connection cables 1152. Power supply 1150 can be directly connected to other devices of electronic device 1100, such as one or more input/output components 1140. In some examples, electronic device 1100 can receive power from another power sources (e.g., an external charging device).

According to some embodiments, the electronic device 1100 can include memory 1160, which can include a single disk or multiple disks (e.g., hard drives), and includes a storage management module that manages one or more partitions within memory 1160. In some cases, memory 1160 can include flash memory, semiconductor (solid state) memory or the like. Memory 1160 can also include a Random Access Memory ("RAM") and a Read-Only Memory ("ROM"). The ROM can store programs, utilities or processes to be executed in a non-volatile manner. The RAM can provide volatile data storage, and stores instructions related to the operation of the electronic device 1100. In some embodiments, memory 1160 refers to a non-transitory computer readable medium. One or more processors 1110 can also be used to execute software applications. In some embodiments, a data bus 1162 can facilitate data transfer between memory 1160 and one or more processors 1110.

According to some embodiments, electronic device 1100 can include wireless communications components 1170. A network/bus interface 1172 can couple wireless communications components 1170 to one or more processors 1110. Wireless communications components 1170 can communicate with other electronic devices via any number of wireless communication protocols, including at least one of a global network (e.g., the Internet), a wide area network, a local area network, a wireless personal area network (WPAN), or the like. In some examples, the wireless communications components 1170 can communicate using NFC protocol, BLUETOOTH® protocol, or WIFI® protocol.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An electronic device, comprising:
a base portion comprising a first housing part and a second housing part, the first housing part and the second housing part defining an interior volume in fluidic communication with an external environment;
an air diverter coupled to the base portion, the air diverter comprising a first end and a second end opposite the first end;
a display portion rotationally coupled to the base portion and capable of angular displacement therefrom, wherein the display portion comprises an extension that is configured to:
contact the air diverter in response to the display portion moving from a first angular displacement to a second angular displacement, thereby placing the air diverter in a first position; and
contact the air diverter in response to the display portion moving from the second angular displacement to the first angular displacement, thereby placing the air diverter is in a second position, wherein the first end and the second end of the air diverter remain between the first housing part and the second housing part at the first position and at the second position.

2. The electronic device of claim 1, wherein:
the extension is out of contact with the air diverter in response to the display portion between the first angular displacement and the second angular displacement; and
the second angular displacement is less than 90 degrees relative to the base portion.

3. The electronic device of claim 2, wherein the extension is out of contact with the air diverter in response to the angular displacement of the display portion is greater than the second angular displacement.

4. The electronic device of claim 1, wherein the base portion further comprises a fan:
positioned upstream from the air diverter; and
having a fan outlet configured to expel air out of the base portion and towards the air diverter such that the expelled air is exhausted out to the external environment.

5. The electronic device of claim 1, wherein the air diverter comprises a louver.

6. The electronic device of claim 5, wherein:
the louver is rotationally coupled to the base portion by a shaft inserted through an opening of the louver; and
contact between the extension and the louver rotates the louver between the first position and the second position.

7. An electronic device, comprising:
a base portion defining an interior volume in communication with an external environment, the base portion comprising a keyboard;
an air diverter coupled to the base portion and movable relative to the keyboard, the air diverter at least partially positioned within the interior volume; and
a display portion rotationally coupled to the base portion and capable of angular displacement therefrom, wherein the display portion comprises an extension configured to:
separate from the air diverter in response to the display portion positioned at a first angular displacement and at a second angular displacement different from the first angular displacement;
provide a first point of contact with the air diverter while the display portion is rotated to the first angular displacement; and
provide a second point of contact with the air diverter while the display portion is rotated to the second angular displacement greater than the first angular displacement.

8. The electronic device of claim 7, wherein:
the second angular displacement is less than 90 degrees relative to the base portion.

9. The electronic device of claim 8, wherein:
the extension is out of contact with the air diverter in response to the display portion being between the second angular displacement and a third angular displacement greater than the second angular displacement; and
the third angular displacement is at an obtuse angle relative to the base portion.

10. The electronic device of claim 9, wherein the extension it out of contact with the air diverter in response to display portion being greater than the third angular displacement.

11. The electronic device of claim 7, wherein:
the extension comprises a first surface and a second surface;
at the first point of contact, the first surface is in contact with the air diverter; and
at the second point of contact, the second surface is in contact with the air diverter.

12. The electronic device of claim 7, wherein:
the extension comprises a first extension and a second extension, wherein the first extension is separated from the second extension;
at the first point of contact, the first extension is in contact with the air diverter; and
at the second point of contact, the second extension is in contact with the air diverter.

13. The electronic device of claim 7, wherein the air diverter comprises a louver.

14. The electronic device of claim 13, wherein:
the louver is rotationally coupled to the base portion by a shaft inserted through an opening of the louver; and
contact between the extension and the louver rotates the louver.

15. An electronic device, comprising:
a base portion defining an interior volume in fluidic communication with an external environment by way of an air path, the base portion comprising:
a first housing part;
a keyboard carried by the first housing part; and
a second housing part coupled with the first housing part;
a display portion rotationally coupled to the base portion; and
an air diverter at least partially located in the base portion and defining the air path, wherein the air diverter is configured to:
rotate, relative to the keyboard, in response to rotation of the display portion and in a rotation direction that is opposite that of a rotation direction of the display portion; and
modify the air path when rotated, wherein the air diverter is rotatable between the first housing part and the second housing part.

16. The electronic device of claim 15, wherein:

rotation of the display portion in a counterclockwise direction causes the air diverter to rotate in a clockwise direction; and rotation of the display portion in the clockwise direction causes the air diverter to rotate in the counterclockwise direction.

17. The electronic device of claim 15, wherein:

the air diverter is configured to rotate between a first position and a second position different from the first position; and rotation of the air diverter between the first position and the second position causes a corresponding change in direction of the air path.

18. The electronic device of claim 17, wherein:

when the air diverter is in the first position, air is expelled from the base portion in a direction of a first air path; and when the air diverter is in the second position, air is expelled from the base portion in a direction of a second air path.

19. The electronic device of claim 15, wherein:

the air diverter is configured to rotate between a first position, a second position, and a third position; and rotation of the air diverter between the first position, second position, and third position causes a corresponding change in direction of the air path.

20. The electronic device of claim 19, wherein:

when the air diverter is in the first position, air is expelled from the base portion in a direction of a first air path;

when the air diverter is in the second position, air is expelled from the base portion in a direction of a second air path; and when the air diverter is in the third position, air is expelled from the base portion in a direction of a third air path, wherein the second air path comprises the first air path and the third air path.

* * * * *

UNITED STATES PATENT AND TRADEMARK OFFICE
CERTIFICATE OF CORRECTION

PATENT NO. : 11,892,886 B2
APPLICATION NO. : 17/658992
DATED : February 6, 2024
INVENTOR(S) : Brett W. Degner It is certified that error appears in the above-identified patent and that said Letters Patent is hereby corrected as shown below:

In the Claims

Column 20, Lines 20-21 (Claim 10): "extension it out of" should read: --extension is out of--.

Signed and Sealed this
Sixteenth Day of April, 2024

Katherine Kelly Vidal
Director of the United States Patent and Trademark Office